(12) United States Patent
Young et al.

(10) Patent No.: US 11,837,660 B2
(45) Date of Patent: *Dec. 5, 2023

(54) SEMICONDUCTOR DEVICE AND METHOD

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 8 days.

This patent is subject to a terminal disclaimer.

(21) Appl. No.: 17/674,361

(22) Filed: Feb. 17, 2022

(65) Prior Publication Data

US 2022/0173252 A1 Jun. 2, 2022

Related U.S. Application Data

(63) Continuation of application No. 16/944,768, filed on Jul. 31, 2020, now Pat. No. 11,289,603.

(Continued)

(51) Int. Cl.
*H01L 29/78* (2006.01)
*H01L 29/06* (2006.01)
(Continued)

(52) U.S. Cl.
CPC .. *H01L 29/78391* (2014.09); *H01L 21/02603* (2013.01); *H01L 21/28185* (2013.01);
(Continued)

(58) Field of Classification Search
CPC ......... H01L 29/78391; H01L 21/02603; H01L 21/28185; H01L 21/3115; H01L 29/0673; H01L 29/42392; H01L 29/4908; H01L 29/516; H01L 29/66742; H01L 29/66795; H01L 29/6684; H01L 29/7851; H01L 29/78696; H01L 21/02178; H01L 21/02181; H01L 21/02192; H01L 21/02194; H01L 21/02304; H01L 21/02321; H01L 21/02356; H01L 29/165;
(Continued)

(56) References Cited

U.S. PATENT DOCUMENTS 6,340,600 B1 1/2002 Joo et al.
8,969,970 B2 3/2015 Sato et al.
(Continued)

FOREIGN PATENT DOCUMENTS

JP 2011044580 A 3/2011
KR 20190047572 A 5/2019
(Continued)

*Primary Examiner* — Tong-Ho Kim
(74) *Attorney, Agent, or Firm* — Slater Matsil, LLP

(57) ABSTRACT

A semiconductor device and method of manufacture are provided which utilizes metallic seeds to help crystallize a ferroelectric layer. In an embodiment a metal layer and a ferroelectric layer are formed adjacent to each other and then the metal layer is diffused into the ferroelectric layer. Once in place, a crystallization process is performed which utilizes the material of the metal layer as seed crystals.

20 Claims, 27 Drawing Sheets

Related U.S. Application Data

(60) Provisional application No. 62/954,267, filed on Dec. 27, 2019.

(51) Int. Cl.
| | | |
|---|---|---|
| *H01L 29/423* | (2006.01) | |
| *H01L 29/49* | (2006.01) | |
| *H01L 29/51* | (2006.01) | |
| *H01L 29/66* | (2006.01) | |
| *H01L 21/02* | (2006.01) | |
| *H01L 21/28* | (2006.01) | |
| *H01L 21/3115* | (2006.01) | |
| *H01L 29/786* | (2006.01) | |

(52) U.S. Cl.
CPC ...... *H01L 21/3115* (2013.01); *H01L 29/0673* (2013.01); *H01L 29/42392* (2013.01); *H01L 29/4908* (2013.01); *H01L 29/516* (2013.01); *H01L 29/6684* (2013.01); *H01L 29/66742* (2013.01); *H01L 29/66795* (2013.01); *H01L 29/7851* (2013.01); *H01L 29/78696* (2013.01)

(58) Field of Classification Search
CPC ............. H01L 29/267; H01L 29/66545; H01L 29/7848; H01L 29/0847; H01L 29/785; H01L 21/28008; H01L 29/517
USPC ........................................................ 257/295
See application file for complete search history.

(56) References Cited

U.S. PATENT DOCUMENTS

| | | | |
|---|---|---|---|
| 11,289,603 B2* | 3/2022 | Young | ................ H01L 21/3115 |
| 2013/0101867 A1 | 4/2013 | Yukinobu et al. | |
| 2019/0096767 A1 | 3/2019 | Yeh et al. | |
| 2019/0131382 A1 | 5/2019 | Lu et al. | |
| 2019/0165103 A1 | 5/2019 | Lu et al. | |
| 2021/0183708 A1* | 6/2021 | Yeh | ................... H01L 29/78391 |

FOREIGN PATENT DOCUMENTS

| | | |
|---|---|---|
| TW | 543094 B | 7/2003 |
| WO | 2011155635 A1 | 12/2011 |

* cited by examiner

SEMICONDUCTOR DEVICE AND METHOD

PRIORITY CLAIM AND CROSS-REFERENCE

This application is a continuation of U.S. patent application Ser. No. 16/944,768, filed on Jul. 31, 2020, entitled "Semiconductor Device and Method", which claims the benefit of U.S. Provisional Application No. 62/954,267, filed on Dec. 27, 2019, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
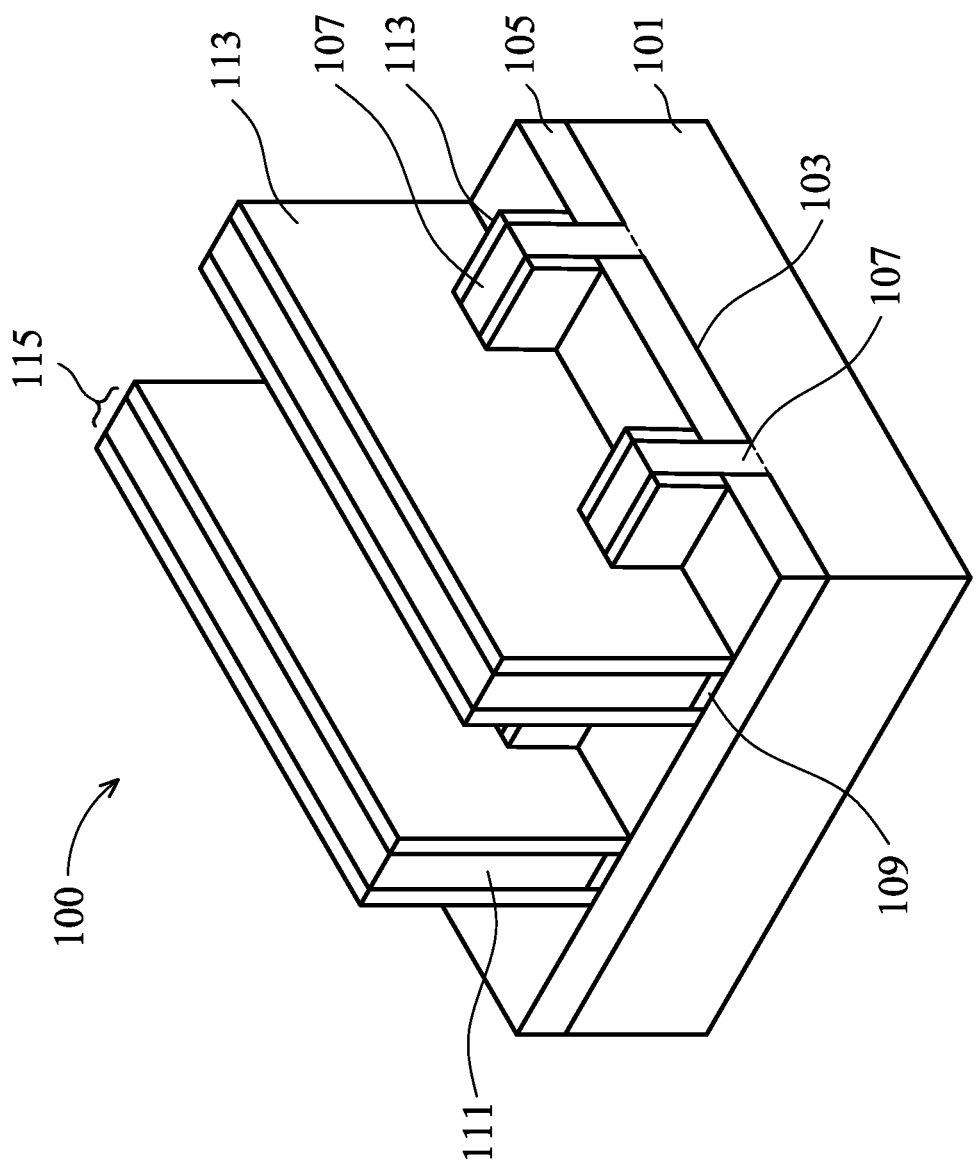
FIG. 1 illustrates a perspective view of manufacturing processes in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of manufacturing processes to form negative capacitance field effect transistors (NCFETs) 100 or ferroelectric field effect transistors (FEFET), in which ferroelectric materials are utilized along with dielectric materials use an S-shape polarization/electric field characteristic which leads to an negative-capacitance region that can lead to transistor switching with a lower voltage. In an embodiment the NCFET 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of the field effect transistors. While FIG. 1 only illustrates two fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å, such as about 50 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
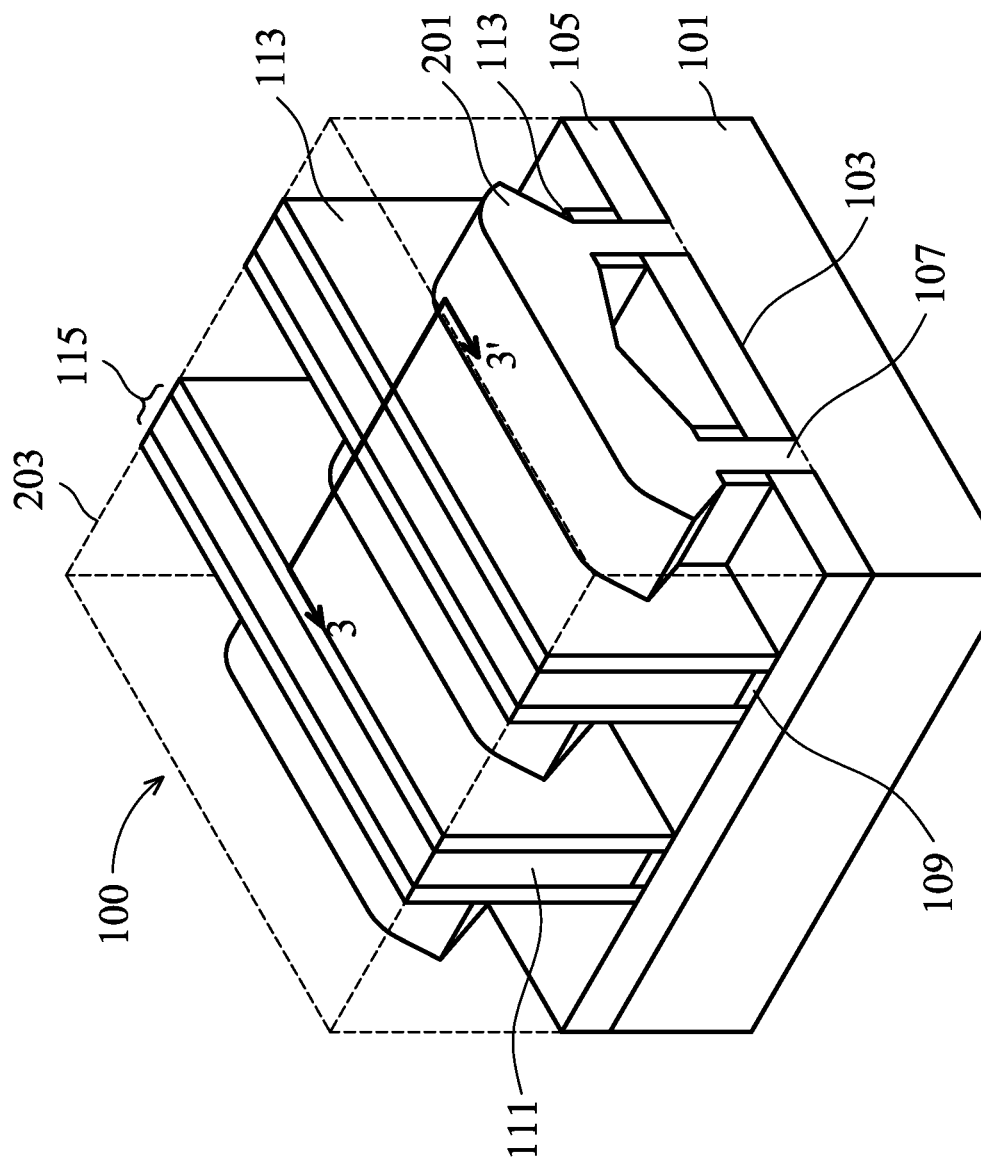
FIG. 2 illustrates formation of source/drain regions in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks. However, any suitable process may be utilized.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the field effect transistor is a p-type device, the source/drain regions 201 may be regrown through a selective epitaxial process with a material, such as silicon or else a material such as silicon germanium that has a different lattice constant than the channel regions. In other embodiments the source/drain regions 201 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å, and may have a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted or, in other embodiments, n-type dopants such as phosphorous, arsenic, antimony, or the like may be implanted. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Optionally, if desired, a first etch stop layer may be formed over the structure prior to the deposition of the ILD layer 203 (e.g., over the source/drain regions 201). In one embodiment, the first etch stop layer may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer, such as low pressure CVD (LPCVD), PVD, or the like, could alternatively be used. The first etch stop layer 202 may have a thickness of between about 5 Å and about 200 Å or between about 5 Å and about 50 Å.

Figure 3:
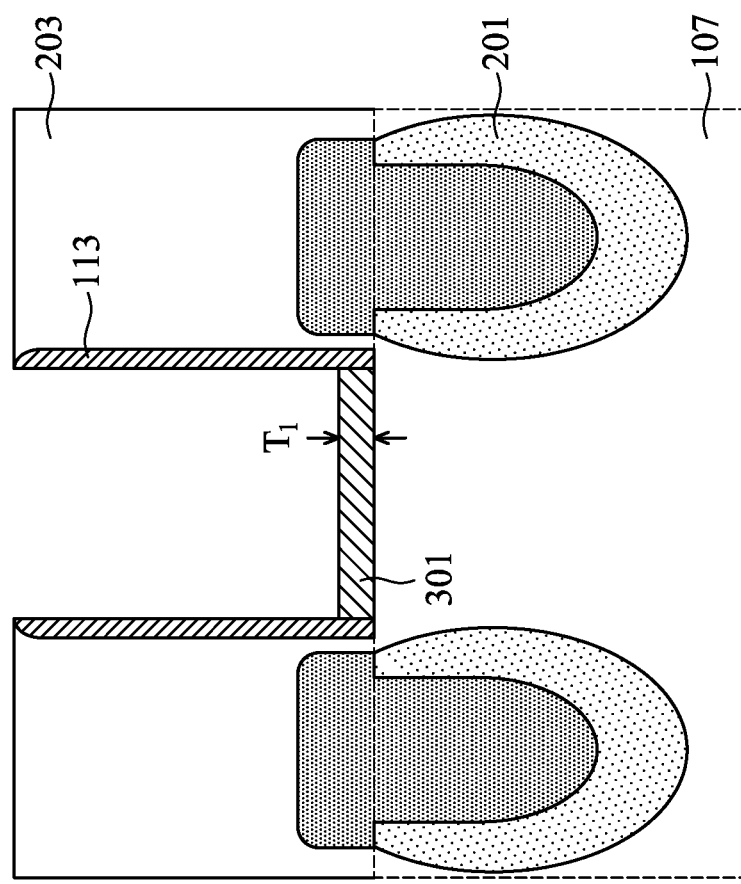
FIG. 3 illustrates a cross sectional view formation of an interfacial layer in accordance with some embodiments.

FIG. 3 illustrates a cross sectional view of the structure of FIG. 2 along line 3-3', and also illustrates that, after the formation of the ILD layer 203, the material of the dummy gate electrode 111 and the dummy gate dielectric 109 may be removed and replaced to form a gate stack 803 (not illustrated in FIG. 3 but illustrated and described further below with respect to FIG. 8). In an embodiment the dummy gate electrode 111 and the dummy gate dielectric 109 may be removed using, e.g., a wet or dry etching process that utilizes etchants that are selective to the material of the dummy gate electrode 111 and the dummy gate dielectric 109. However, any suitable removal process may be utilized.

FIG. 3 additionally illustrates formation of an interfacial layer 301 adjacent to the fin 107. In an embodiment the interfacial layer 301 may be a material such as silicon dioxide formed through a process such as in situ steam generation (ISSG) or a deposition process such as chemical vapor deposition or atomic layer deposition. In another embodiment the interfacial layer 301 may be a high-k material such as $HfO_2$, HfSiO, HfSiON, HfTaO, HfTiO, HfZrO, LaO, ZrO, $Ta_2O_5$, combinations of these, or the like, and has a first thickness $T_1$ of between about 5 Å and about 20 Å, such as about 10 Å. In embodiments which utilize a deposition process, the interfacial layer 301 may be formed conformably, while in embodiments in which ISSG is utilized the interfacial layer 301 may be formed along the bottom of the opening without extending along the sidewalls.

Figure 4:
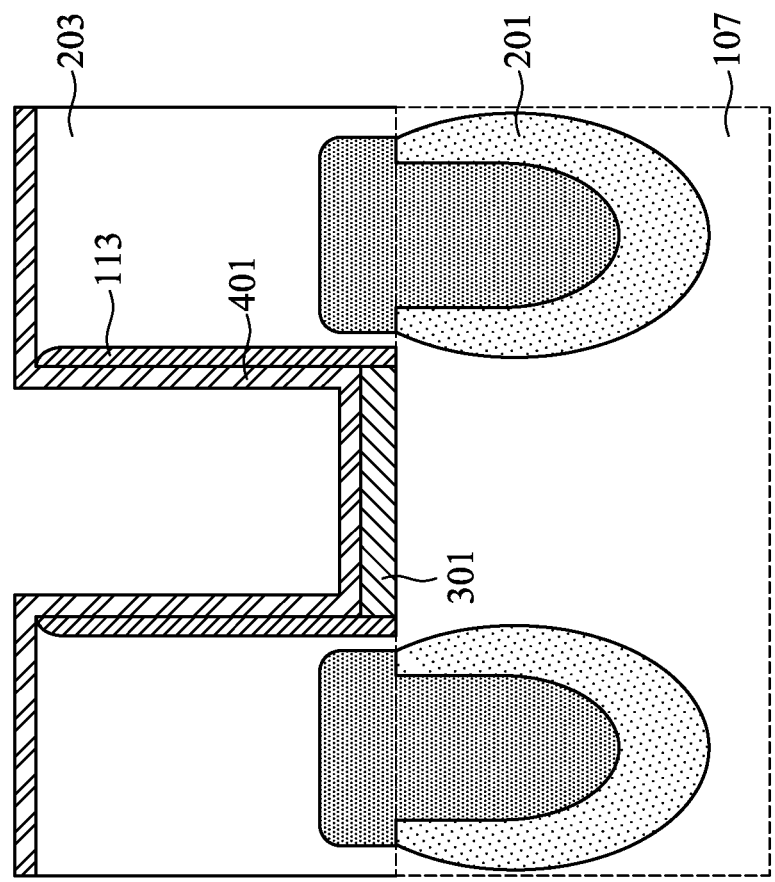
FIG. 4 illustrates formation of a metal layer in accordance with some embodiments.

FIG. 4 illustrates formation of a metal layer 401 adjacent to the interfacial layer 301 and along sidewalls of the first spacers 113. In an embodiment the metal layer 401 comprises a material which can easily diffuse into a ferroelectric film 501 (e.g., a ferroelectric film 501 illustrated and described below with respect to FIG. 5A) and also be able to become seeds in order to assist the ferroelectric film 501 to crystallize (described further below with respect to FIG. 6).

In some embodiments the material of the metal layer 401 comprises a metal that can be used as a seed during the crystallization process. In some embodiments the metal may be a metal such as nickel, magnesium, aluminum, combinations of these, or the like, or else may be another material such as titanium (Ti), germanium (Ge), tin (Sn), combinations of these, or the like. However, any suitable material may be used.

Additionally, in order to help place and control the movement of the metal, the metal layer 401 may also comprise a transportation element bonded to the metal. In some embodiments the transportation element may be an element such as oxygen, which can be used to help deposit the material of the metal layer 401. However, any suitable transportation element may be utilized.

In particular embodiments, the metal and the transportation element are combined to form the material of the metal layer 401. In a particular embodiment in which the metal is nickel and the transportation element is oxygen, the metal layer 401 may be a material such as nickel oxide (NiO). Similarly, in embodiments in which the metal is magnesium and the transportation element is oxygen, the metal layer 401 may be a material such as magnesium oxide (MgO), and in embodiments in which the metal is aluminum and the transportation element is oxygen, the metal layer 401 may be a material such as aluminum oxide ($Al_2O_3$). In yet other embodiments in which the metal is titanium and the transportation element is oxygen, the metal layer 401 may be titanium oxide ($TiO_2$) while in embodiments in which the metal is tin and the transportation element is oxygen the metal layer 401 may be tin oxide ($SnO_2$). However, any suitable material may be utilized.

In an embodiment the metal layer 401 may be deposited using a deposition process such as chemical vapor deposition, physical vapor deposition, atomic layer deposition, combinations of these, or the like. Additionally, the metal layer 401 may be deposited to a thickness of between about 0.5 nm and about 5 nm, such as about 1 nm. However, any suitable process of deposition and any suitable thickness may be utilized.

Figure 5A:
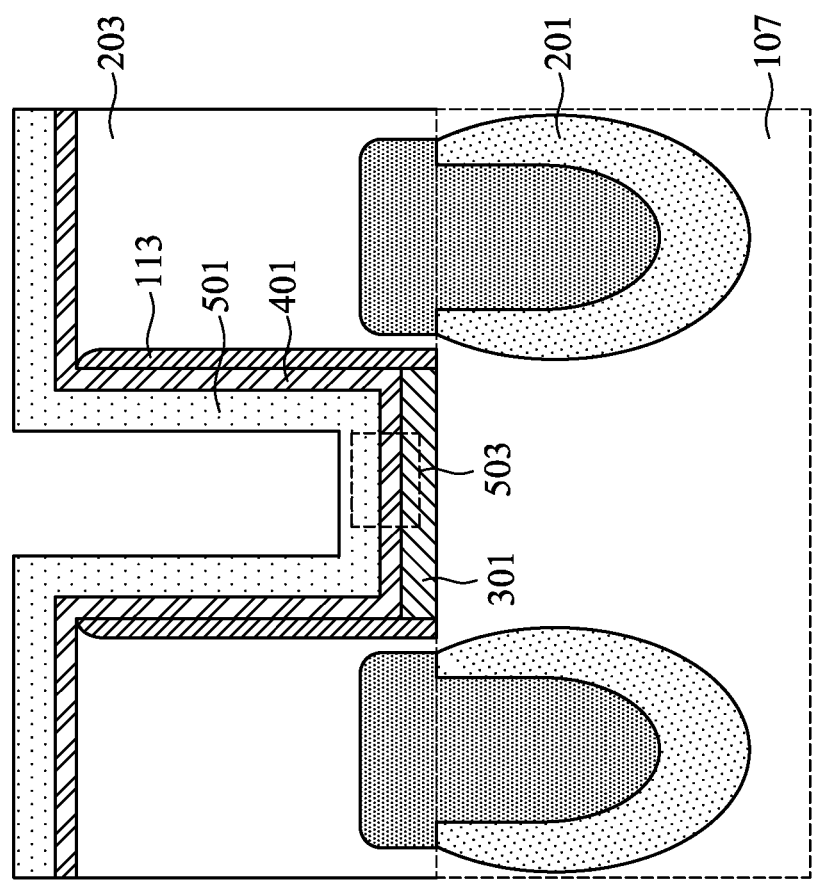
FIGS. 5A-5B illustrate a formation of a ferroelectric layer in accordance with some embodiments.

FIG. 5A illustrates a formation of a ferroelectric film 501 over the metal layer 401. In some embodiments, ferroelectric film 501 is deposited as an amorphous matrix layer using a high-k material (e.g., with a relative permittivity greater than about 5) such as hafnium oxide ($HfO_2$), aluminum scandium nitride (AlScN), zirconium oxide ($ZrO_2$), HfSiO, HfSiON, HfTaO, HfTiO, HfZrO, LaO, ZrO, $Ta_2O_5$, combinations of these, or the like may be used. According to some embodiments, the ferroelectric film 501 is deposited through a process such as atomic layer deposition (ALD), chemical vapor deposition, or physical vapor deposition to a thickness of between about 3 nm and about 20 nm, such as about 5 nm. However, any suitable materials, any suitable deposition process, and any suitable thicknesses may be utilized for the ferroelectric film 501.

Additionally, the thicknesses of the metal layer 401 and the ferroelectric film 501 may be modified relative to each other so that, in subsequent processing, a desired concentration of the dopants may be achieved. For example, in some embodiments a ratio of the thickness of the ferroelectric film 501 to the thickness of the metal layer 401 may be between about 5 and about 20, such as about 10. If the ratio is too low (e.g., the metal layer 401 is too thick), the doping concentration might be so that that the crystal size might be too small or else may result in the wrong crystalline phase, while if the ratio is too high (e.g., the metal layer 401 is too thin), there will not be a sufficient concentration of the dopant to achieve the desired crystal size control effect. However, any suitable ratio may be utilized.

Figure 5B:
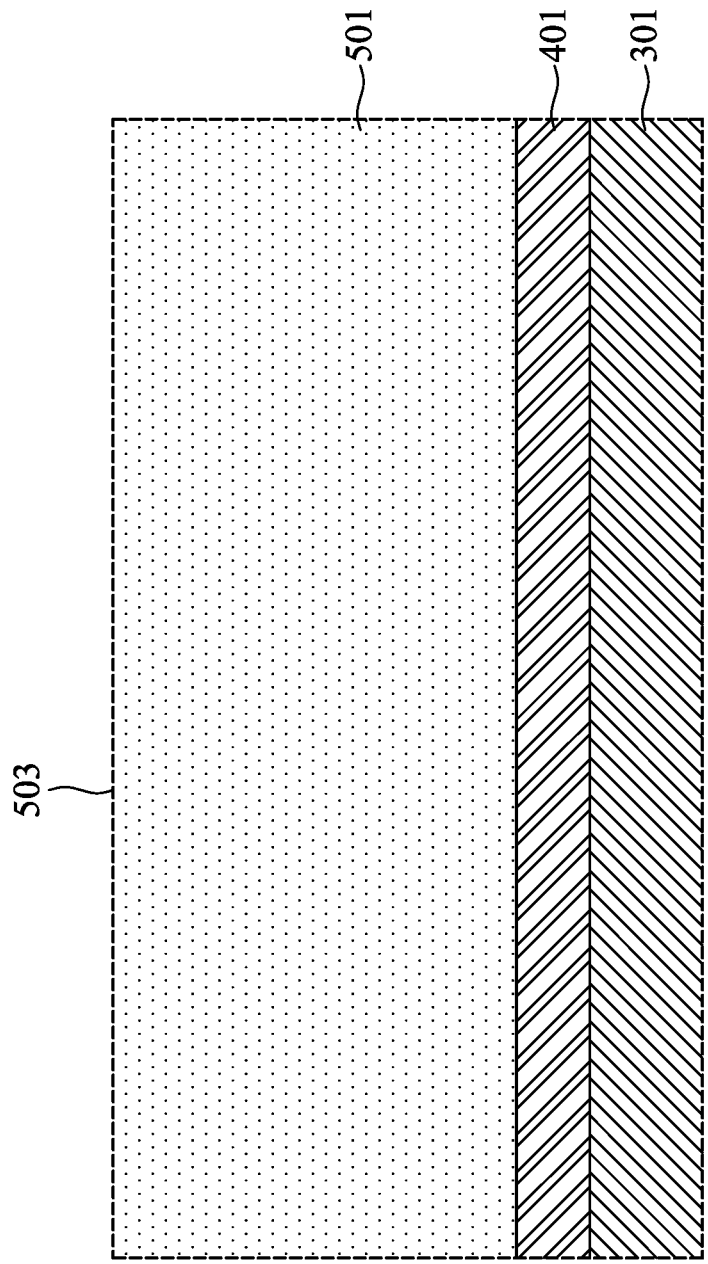

FIG. 5B illustrates a close up view of the dashed box 503 in FIG. 5A. As can clearly be seen in this view, the metal layer 401 at this point in the manufacturing process, is located between the interfacial layer 301 and the overlying ferroelectric film 501. Such an initial placement allows for the subsequent diffusion of the material of the metal layer 401 into the ferroelectric film 501.

Figure 6A:
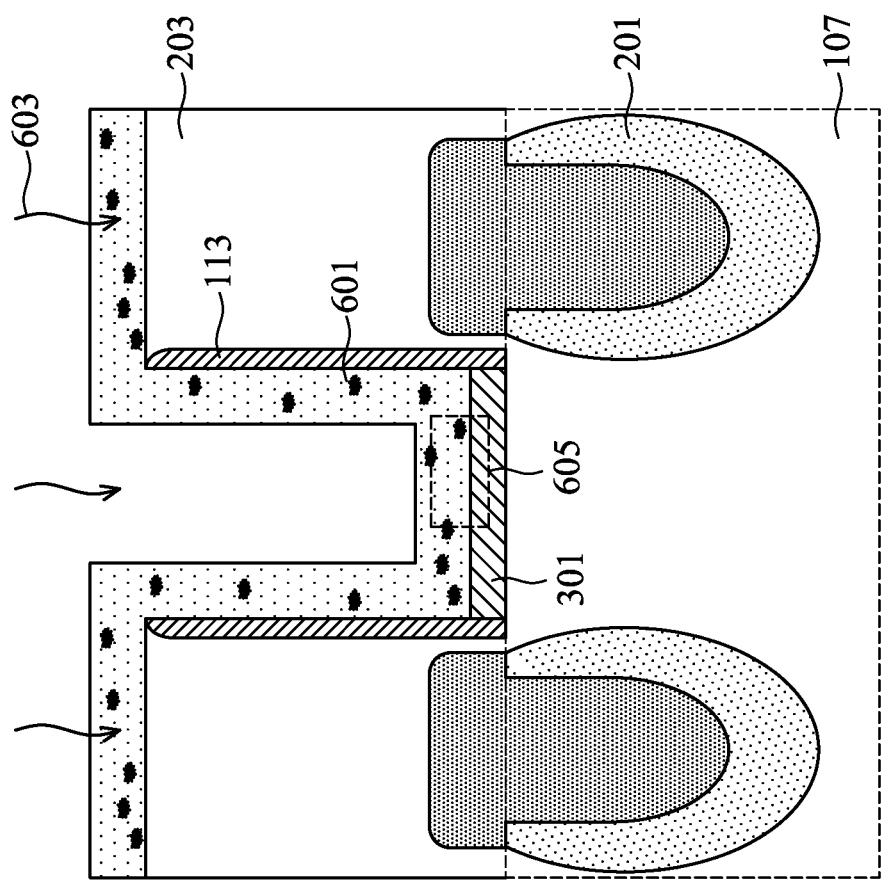
FIGS. 6A-6C illustrate a first annealing process in accordance with some embodiments.

FIG. 6A illustrates that, in order to help initiate and/or speed the diffusion of the material of the metal layer 401 into the ferroelectric film 501, an annealing process (represented in FIG. 6A by the wavy lines labeled 603) may be performed in order to form a seeded ferroelectric film 601. In an embodiment the first annealing process 603 may be a furnace annealing process, whereby the structure is placed into a furnace and is surrounded by an inert environment. In an embodiment the inert environment may be an inert gas such as argon, neon, or the like, or else may be an environment which is non-reactive to the exposed surfaces. Once the structure is within the furnace, the furnace will use heating elements to raise the temperature of the inert environment and, thus raise the temperature of the metal layer 401 and the ferroelectric film 501.

In an embodiment, the first annealing process 603 may raise the temperature of the metal layer 401 and the ferroelectric film 501 to be between about 300° C. and about 600° C., such as about 400° C. Additionally, in order to allow the metal within the metal layer 401 sufficient time to diffuse into the ferroelectric film 501, the first annealing process 603 may be performed for a time of between about 1 minute and about 60 minutes. However, any suitable time and temperature may be utilized.

Additionally, while a furnace annealing process is described above as one embodiment of the first annealing process 603, this is intended to be illustrative and is not intended to be limiting in any fashion. Rather, any suitable annealing process, such as rapid thermal anneals, flash anneals, laser anneals, combinations of these, or the like, may also be used. Any suitable method of annealing the metal layer 401 and the ferroelectric film 501 may be utilized, and all such methods are fully intended to be included within the scope of the embodiments.

Figure 6B:
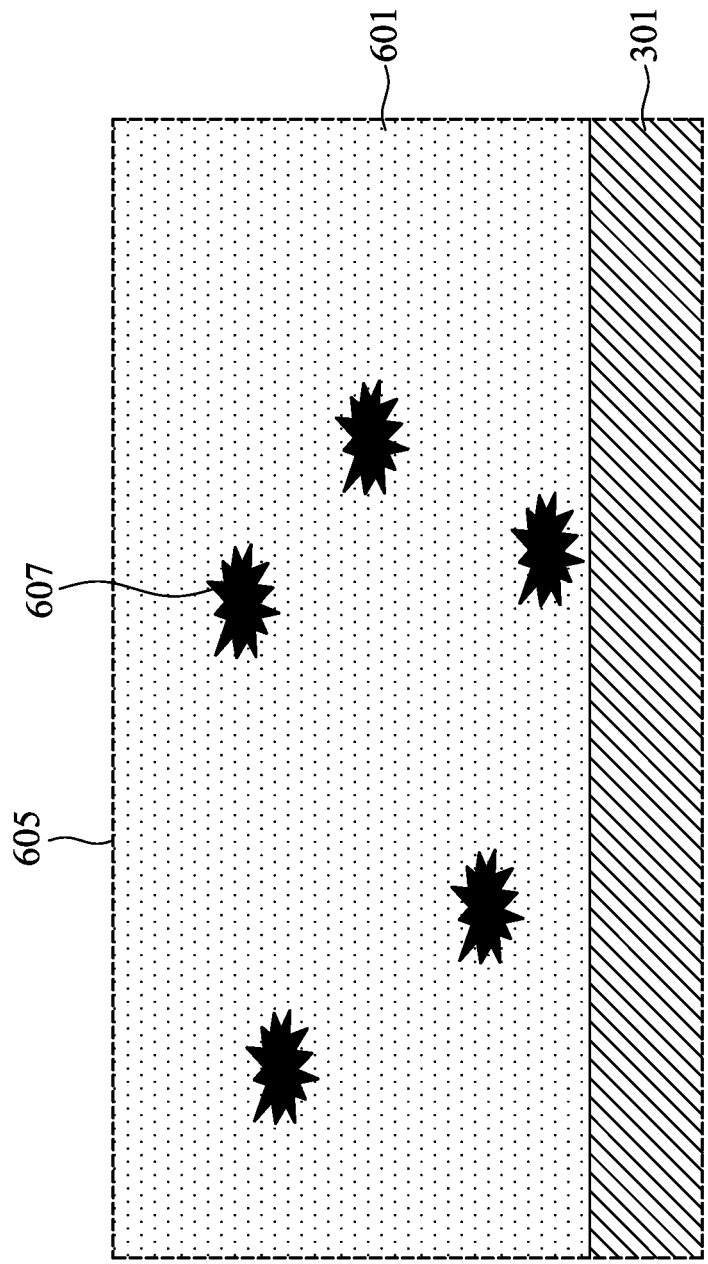

FIG. 6B illustrates a close up view of the dashed box 605 in FIG. 6A. As can be seen, during the first annealing process 603, the material of the metal layer 401 will diffuse into the ferroelectric film 501 and form the seeded ferroelectric film 601. As such, as the material of the metal layer 401 diffuses, the metal layer 401 will be absorbed into the seeded ferroelectric film 601 and effectively disappear. Accordingly, the material of the seeded ferroelectric film 601 will be in physical contact with the underlying interfacial layer 301.

Within the seeded ferroelectric film 601, the first annealing process 603 will continue until the metal atoms are evenly distributed through the seeded ferroelectric film 601 and become seeds 607. In a particular embodiment, the first annealing process 603 is continued until the metal atoms and, thus, the seeds 607, have a density within the seeded ferroelectric film 601 of between about 10,000 seeds/µm² (which may result in a grain size of about 10 nm) to about 250,000 seeds/µm² when measured using a transmission electron microscopy process. In other embodiments the seeds 607 may have a concentration of between about 90,000 seeds/µm² and about 1,000,000 seeds/µm² (which may result in a grain size of about 1 nm) such as about 160,000 seeds/µm². If the grain size is larger than described, the uniformity will be negatively affected, while if the grain size is too small we might get worse crystallinity. However, any suitable concentration may be utilized.

Figure 6C:
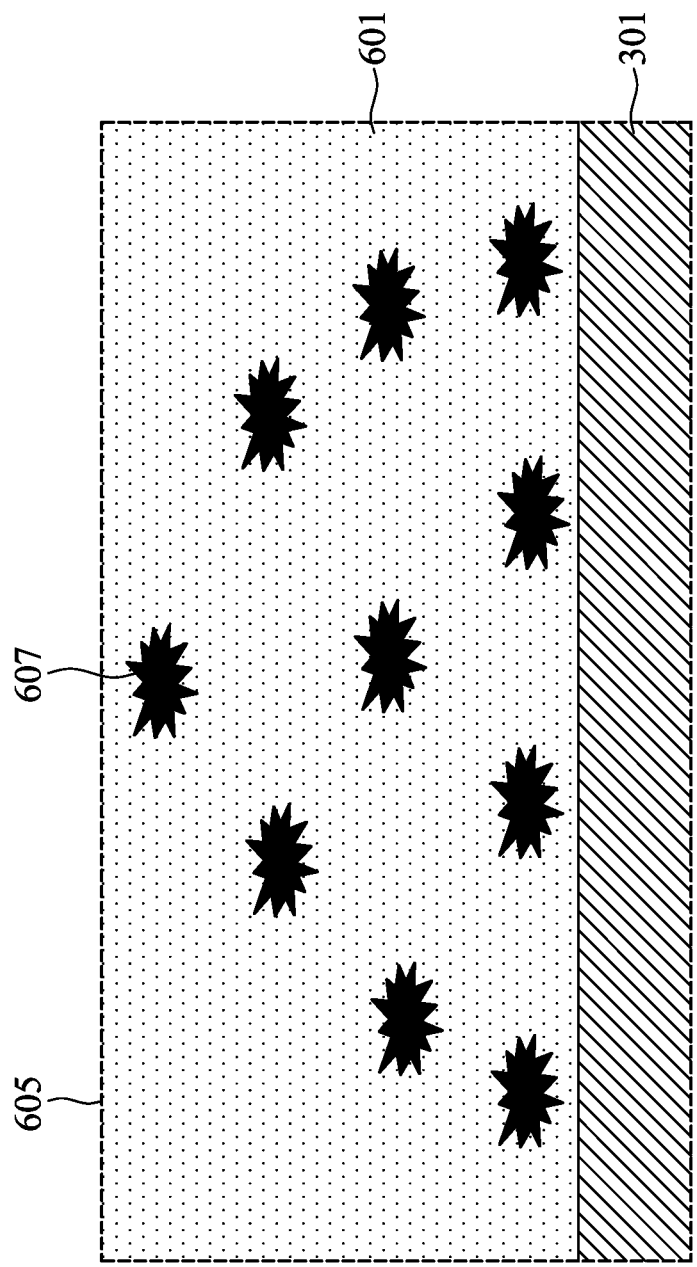

FIG. 6C illustrates another embodiment in which the first annealing process 603 may be ended prior to the metal atoms having a constant concentration distributed throughout the seeded ferroelectric film 601. In such an embodiment there is not a constant concentration of the seeds 607 and, instead, there is a gradient concentration of the seeds 607, wherein there is a higher concentration of seeds 607 adjacent to a side of the seeded ferroelectric film 601 that was previously located adjacent to the metal layer 401, and a lower concentration of seeds 607 located adjacent to an opposite side of the seeded ferroelectric film 601.

Additionally, if desired, the concentration of the seeds 607 may be modified from one process to a subsequent process by modifying the thickness of the metal layer 401 when the metal layer 401 is deposited. In particular, if a larger concentration of seeds 607 is desired, a thicker metal layer 401 may be formed, while if a smaller concentration of seeds 607 is desired, a thinner metal layer 401 may be formed. For example, in an embodiment in which a lower concentration of seeds 607 is desired (e.g., a concentration of between about 10,000 seeds/µm² and about 90,000 seeds/µm²), the metal layer 401 may be formed to a thickness of about 0.5 nm. In another embodiment in which a higher concentration of seeds 607 is desired (e.g., a concentration of between about 160,000 seeds/µm² and about 250,000 seeds/µm²), the metal layer 401 may be formed to a larger thickness of about 2 nm. However, any suitable concentrations and thicknesses may be utilized.

Also, depending upon the specific materials chosen for the metal layer 401 and the ferroelectric film 501, the material of the metal layer 401 may or may not react with the material of the ferroelectric film 501 as the material of the metal layer 401 diffuses into the ferroelectric film 501. For example, in an embodiment in which magnesium oxide is utilized as the material of the metal layer 401 and aluminum scandium nitride (AlScN) is utilized as the material of the ferroelectric film 501, the magnesium oxide will not react as the magnesium oxide diffuses into the ferroelectric film 501. As such, at the end of the first annealing process 603, the magnesium oxide will remain unreacted, and magnesium oxide will be used as the seed 607 in subsequent processing (described further below).

However, in other embodiments, the material of the metal layer 401 will react with the material of the ferroelectric film 501 as the material of the metal layer 401 diffuses into the ferroelectric film 501. For example, in an embodiment in which the material of the metal layer 401 is aluminum oxide ($Al_2O_3$) and the material of the ferroelectric film 501 is a transition metal oxide such as hafnium oxide ($HfO_2$), the aluminum oxide will not only diffuse into the ferroelectric film 501, but will also react with the hafnium oxide to form a byproduct such as $HfAlO_x$. As such, it is this byproduct instead of the original material of the metal layer 401 which is present and which will be used as the seed 607 in the subsequent processing.

Figure 7A:
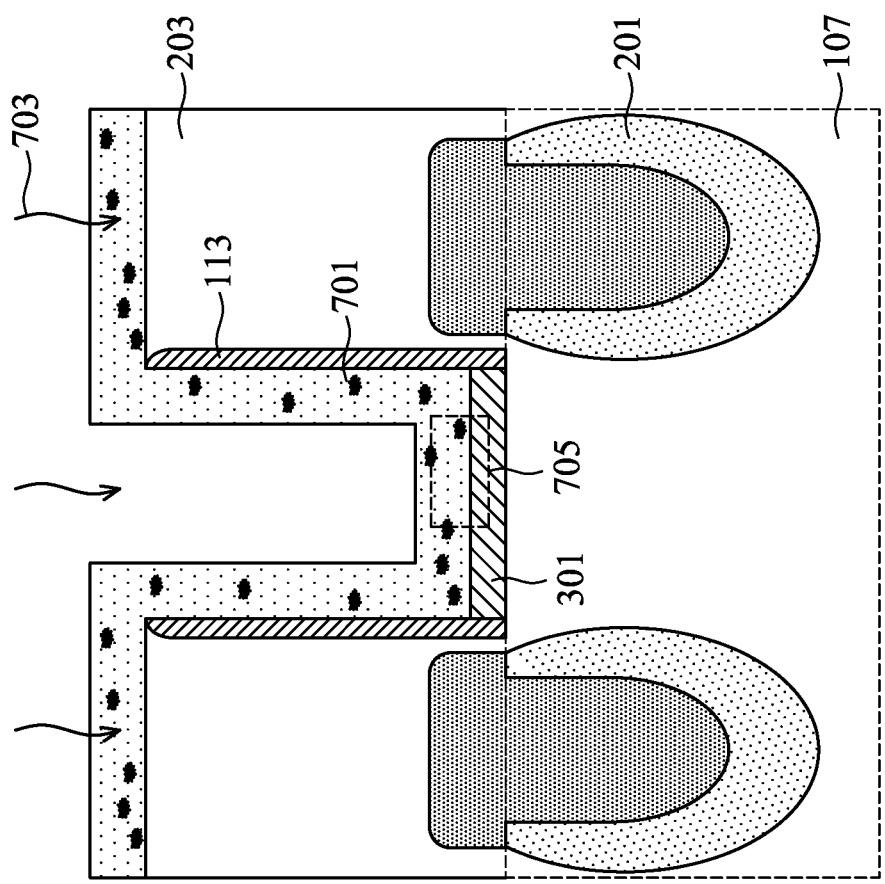
FIGS. 7A-7B illustrate a second annealing process in accordance with some embodiments.

FIG. 7A illustrates that, in order to help initiate a crystallization of the material of the seeded ferroelectric film 601 and form a crystallized ferroelectric layer 701, a second annealing process (represented in FIG. 7A by the wavy lines labeled 703) is performed. In an embodiment the second annealing process 703 may be a thermal annealing process, whereby the structure is placed into an inert environment (e.g., an argon environment) and a temperature of the seeded ferroelectric film 601 is raised. However, any suitable annealing process, such as a rapid thermal anneal, or a flash anneal, may be utilized.

In an embodiment in which a thermal annealing process is utilized, the second annealing process 703 may be performed at a temperature higher than the first annealing process 603 (which was used for diffusion and not necessarily crystallization). In some embodiments the second annealing process 703 may be performed at a temperature that is between about 400° C. and about 800° C., such as about 600° C. higher than the first annealing process 603.

As such, in some embodiments in which the first annealing process 603 is done at a temperature of between about 300° C. and about 600° C., the second annealing process 703 may be performed at a temperature of between about 400° C. and about 800° C., such as about 500° C. Additionally, in order to allow the crystallization process to proceed, the second annealing process 703 may be performed for a time of between about 1 minute and about 60 minutes. However, any suitable time and temperature may be utilized.

Figure 7B:
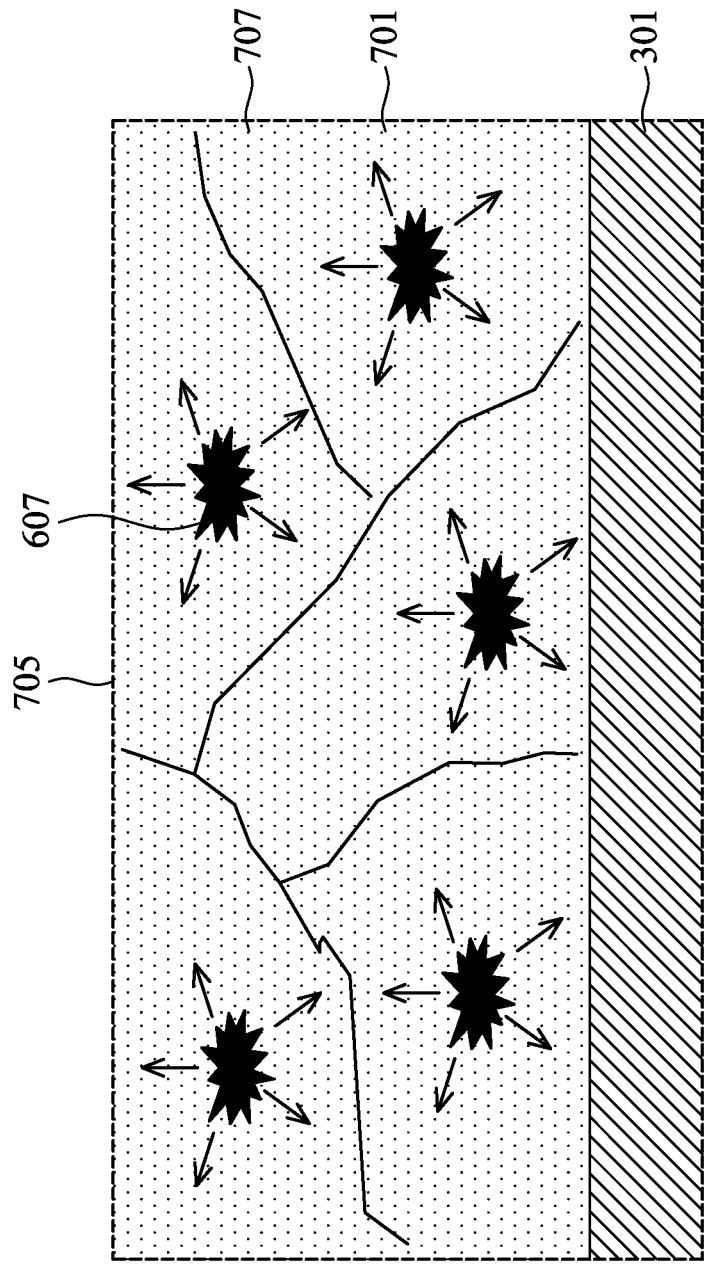

FIG. 7B illustrates a close up view of the dashed box 705 in FIG. 7A. As can be seen, during the second annealing process 703, the material of the seeded ferroelectric film 601 will crystallize using the seeds 607 (e.g., the diffused material of the metal layer 401 or the reaction byproduct of the material of the metal layer 401) as a point of nucleation. As such, during the crystallization process each seed 607 will nucleate a separate crystal 707, with each separate crystal 707 having either a separate crystalline phase or else having similar crystalline phases nucleated from different and separate crystals 707.

In a particular embodiment, the materials chosen for the metal layer 401 and the ferroelectric film 501 will result in a particular crystalline phase resulting from the crystallization process. For example, in an embodiment in which nickel oxide is utilized for the metal layer 401 and hafnium oxide is utilized as the material of the ferroelectric film 501, the crystals 707 will have an orthorhombic crystalline phase. However, any suitable crystalline phase may be utilized.

Either way, the crystallization of each separate crystal 707 will nucleate at the separate seeds 607 and then spread outwards from the separate seeds 607. However, as the crystals 707 grow outwards from the separate seeds 607, a first crystal 707 growing from one seed 607 will eventually run into a second crystal 707 growing from a second seed 607. When this occurs, the crystallizations from the seeds 607 will cease and form a grain boundary between the different crystals 707.

However, because the seeds 607 are evenly distributed within the seeded ferroelectric film 601, the crystals 707 will also be evenly distributed within the crystallized ferroelectric layer 701. Additionally, because the crystals 707 are evenly distributed, the crystals 707 will have a consistent grain size throughout the crystallized ferroelectric layer 701. In an embodiment in which the seeds 607 have a density of between about 10,000 seeds/$\mu m^2$ to about 250,000 seeds/$\mu m^2$, the grain size of the crystals 707 may be between about 2 nm and about 10 nm, such as about 5 nm. However, the density and the grain size may be any suitable density and grain size.

Additionally, while embodiments which utilize two anneals (e.g., the first annealing process 603 and the second annealing process 703) in order to diffuse and then crystallize the materials to form the crystallized ferroelectric layer 701, this is intended to be illustrative and is not intended to be limiting. Rather, any number of annealing processes, such as three or more annealing processes, may be utilized to diffuse and then crystallize the materials, and all such processes are fully intended to be included within the scope of the embodiments.

Figure 8:
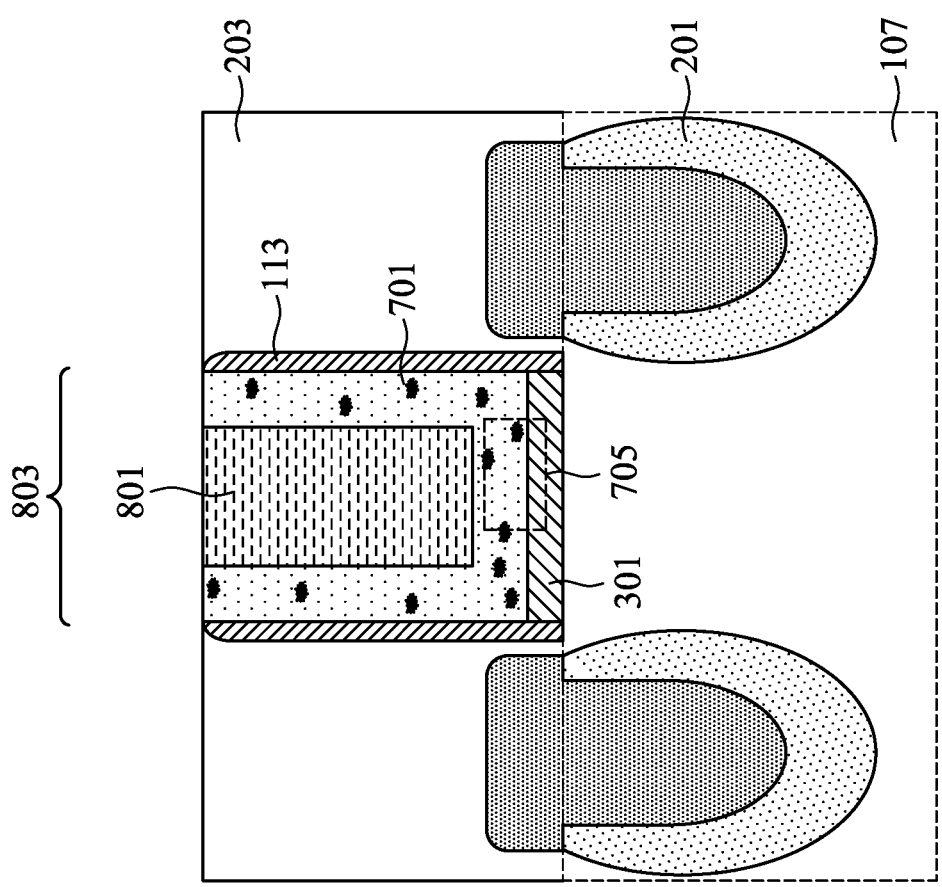
FIG. 8 illustrates a formation of a conductive gate stack in accordance with some embodiments.

FIG. 8 illustrates that once the crystallized ferroelectric layer 701 has been formed, a conductive stack 801 may be formed over the crystallized ferroelectric layer 701 to form the gate stack 803 with the crystallized ferroelectric layer 701. In an embodiment the conductive stack 801 may be formed with a first metal material, a second metal material, and a third metal material (not separately illustrated in FIG. 8). However, any suitable number of layers of material may be utilized.

The first metal material may be formed adjacent to the crystallized ferroelectric layer 701, and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode 111. In an embodiment the third metal material is a metallic material such as W, Al, Cu, AlCu, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

Optionally, after the materials of the gate stack 803 have been formed and planarized, the materials of the gate stack 803 may be recessed and capped with a capping layer (not separately illustrated). In an embodiment the materials of the gate stack 803 may be recessed using, e.g., a wet or dry etching process that utilizes etchants selective to the materials of the gate stack 803. In an embodiment the materials of the gate stack 803 may be recessed a distance of between about 5 nm and about 150 nm, such as about 120 nm. However, any suitable process and distance may be utilized.

Once the materials of the gate stack 803 have been recessed, the capping layer may be deposited and planarized with the first spacers 113. In an embodiment the capping layer is a material such as SiN, SiON, SiCON, SiC, SiOC, combinations of these, or the like, deposited using a deposition process such as atomic layer deposition, chemical vapor deposition, sputtering, or the like. The capping layer may be deposited to a thickness of between about 5 Å and about 200 Å, and then planarized using a planarization process such as chemical mechanical polishing such that the capping layer is planar with the first spacers 113.

By introducing the seeds 607 through the use of the metal layer 401, an additional method of controlling the crystalline phase of the crystallized ferroelectric layer 701 may be utilized. Further, by controlling the thickness of the metal layer 401 and, as such, the concentration of the seeds 607 within the seeded ferroelectric film 601, the process may further be used to control the grain size of the crystals 707 formed within the crystallized ferroelectric layer 701.

Figure 9A:
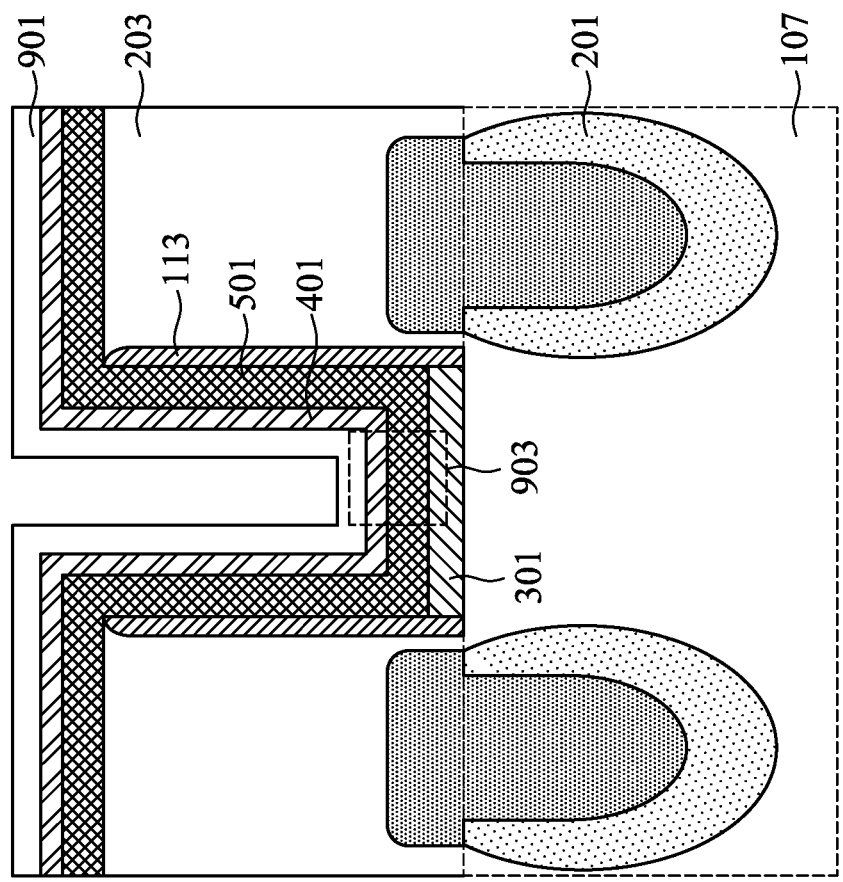
FIGS. 9A-9B illustrate a formation of a capping layer in accordance with some embodiments.
Figure 9B:
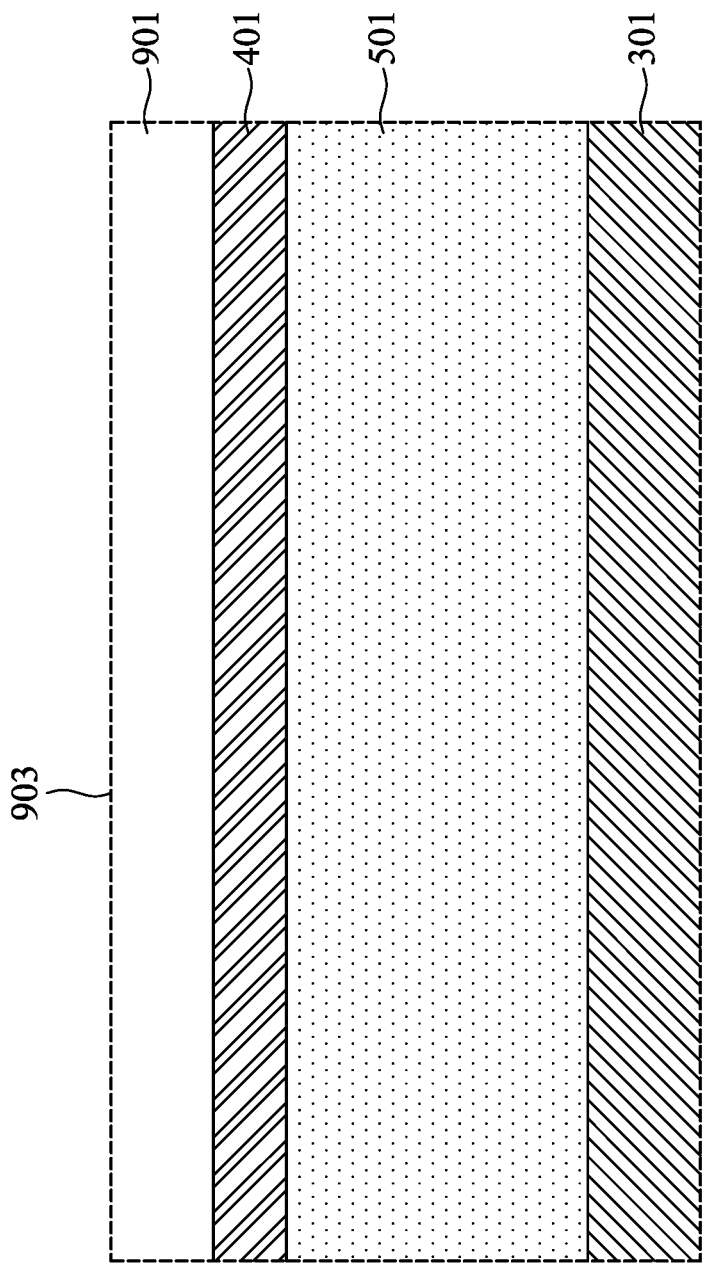

FIGS. 9A-9B illustrate another embodiment in which the metal layer 401 is formed after the formation of the ferroelectric film 501. In this embodiment the ferroelectric film 501 is formed first, with the ferroelectric film 501 deposited directly on the interfacial layer 301. In an embodiment the ferroelectric film 501 and the metal layer 401 may be formed as described above with respect to FIG. 4 and FIGS. 5A-5B. However, any suitable depositions methods and materials may be utilized.

Additionally, however, in this embodiment, once the metal layer 401 has been formed over the ferroelectric film 501, an optional capping layer 901 may be formed over the metal layer 401. In an embodiment the capping layer 901 may be deposited as a single layer or as a multi-layer thin film over the metal layer 401 using one or more materials including metals such as silicon doped titanium nitride (TSN), TiN, TaN, or W; other metalloids such as amorphous silicon (a-Si); high-K dielectrics such as $Al_2O_3$, $ZrO_2$, and $TiO_2$; compounds thereof, or the like. The capping layer 901 may be deposited through a process such as atomic layer deposition (ALD), or the like to a thickness of between about 10 Å and about 50 Å. However, any suitable material, any suitable deposition process, and any suitable thickness may be utilized for the capping layer 901.

Additionally, in order to prevent the metal layer 401 from crystallizing prematurely, the deposition process of the capping layer 901 is kept at a temperature low enough to ensure that the crystallization, if any, is kept to a minimum. For example, in some embodiments the deposition process of the capping layer 901 is kept between about room temperature and about 400° C. However, any suitable temperature may be utilized.

FIG. 9B illustrates a close up view of the dashed box 903 in FIG. 9A. As can clearly be seen in this view, the metal layer 401 at this point in the manufacturing process, is located over the ferroelectric film 501 such that the ferroelectric film 501 is in physical contact with the interfacial layer 301. Additionally, the capping layer 901 is formed over the metal layer 401 so that the metal layer 401 is located between the capping layer 901 and the ferroelectric film 501. Such an initial placement allows for the subsequent diffusion of the material of the metal layer 401 into the ferroelectric film 501 while still allowing for the use of the capping layer 901.

Figure 10A:
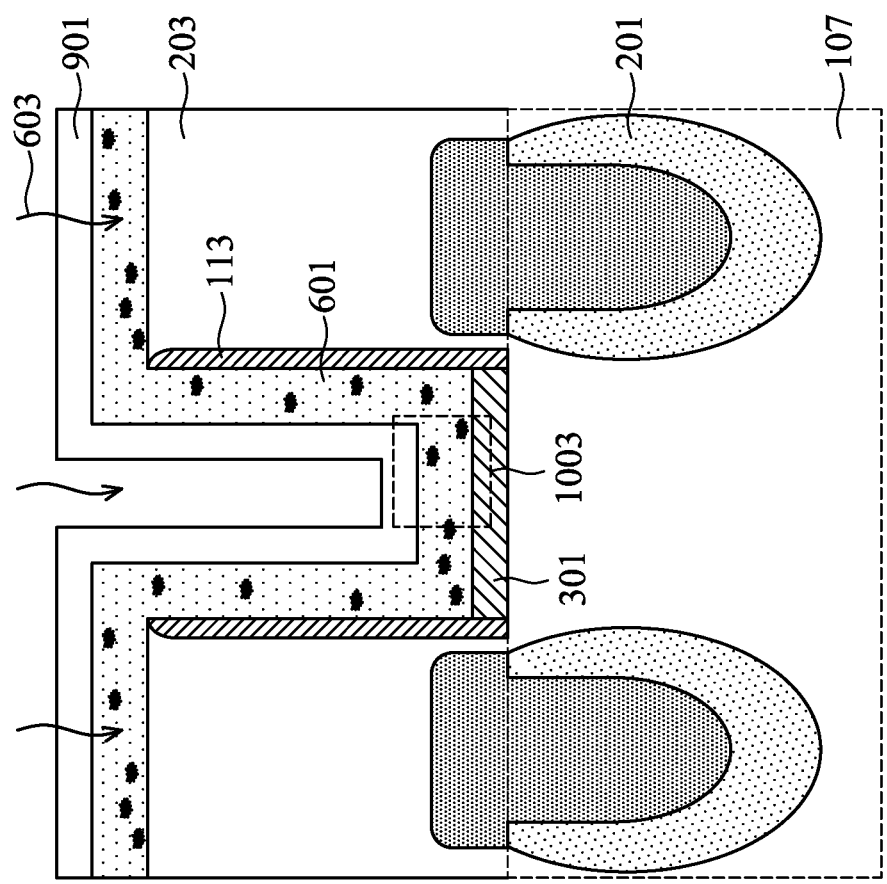
FIGS. 10A-10B illustrate the first annealing process with the capping layer in accordance with some embodiments.
Figure 10B:
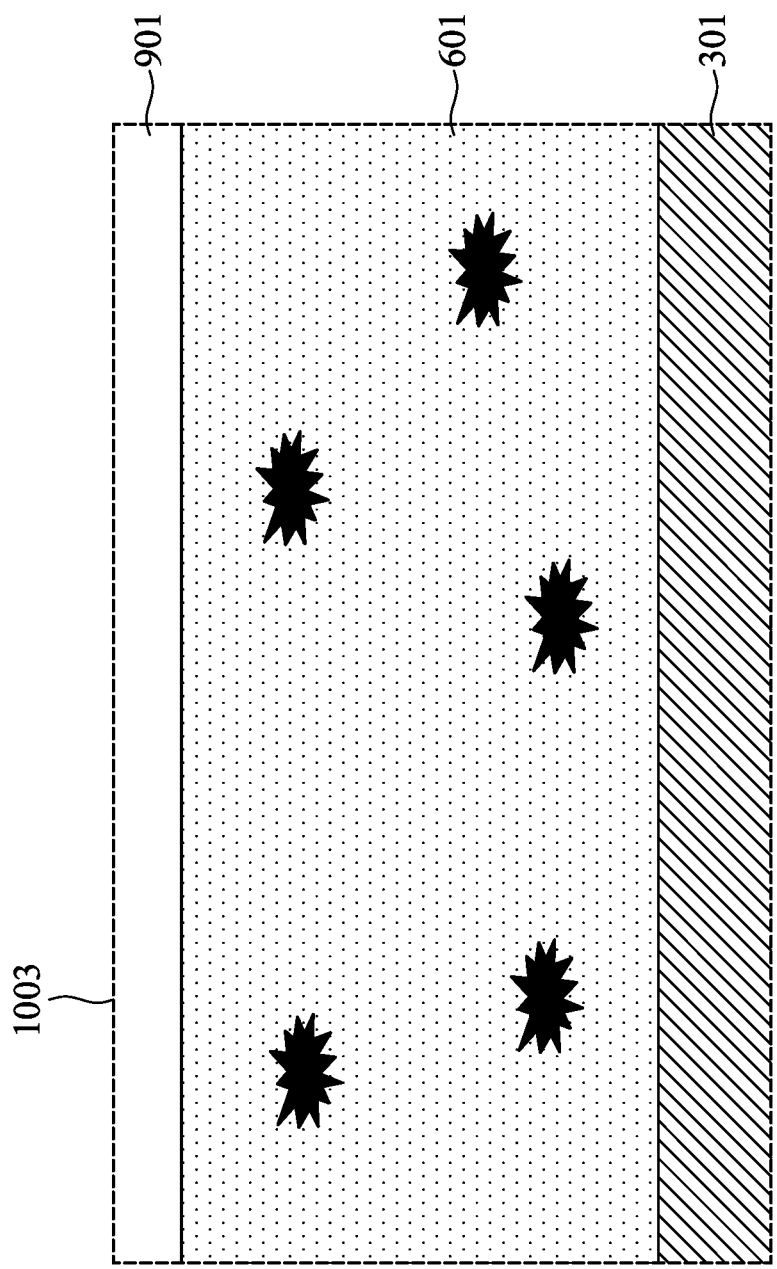

FIGS. 10A-10B illustrate a use of the first annealing process 603 to diffuse the material of the metal layer 401 into the ferroelectric film 501 and form the seeded ferroelectric film 601. In an embodiment the first annealing process 603 may be performed as described above with respect to FIG. 6A, such as by using a thermal annealing process in an inert atmosphere. However, any suitable process may be utilized to diffuse the material of the metal layer 401 into the ferroelectric film 501.

FIG. 10B illustrates a close up view of the dashed box 1003 in FIG. 10A. As illustrated, after the first annealing process 603, the metal layer 401 will effectively be absorbed by the ferroelectric film 501 to form the seeded ferroelectric film 601. As such, the seeded ferroelectric film 601 will be in physical contact with both the interfacial layer 301 as well as the capping layer 901.

Additionally, given the chosen material of the capping layer 901 (e.g., TSN), the metal layer 401 will preferentially diffuse into the ferroelectric film 501 instead of the material of the capping layer 901. In particular, during the first annealing process 603 there is little, if any, diffusion of the material of the metal layer 401 into the material of the capping layer 901. As such, the material of the seeded ferroelectric film 601 is in direct physical contact with the material of the capping layer 901 and the material of the capping layer 901 can be used to apply a stress to the material of the seeded ferroelectric film 601.

Figure 11A:
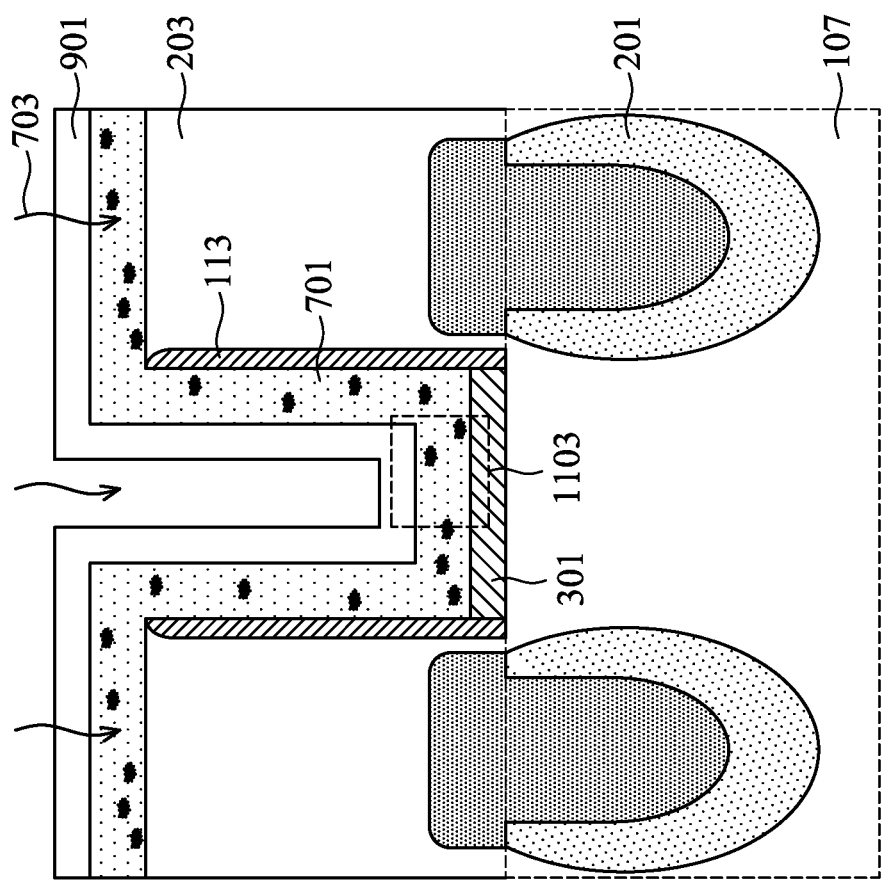
FIGS. 11A-11B illustrate the second annealing process with the capping layer in accordance with some embodiments.
Figure 11B:
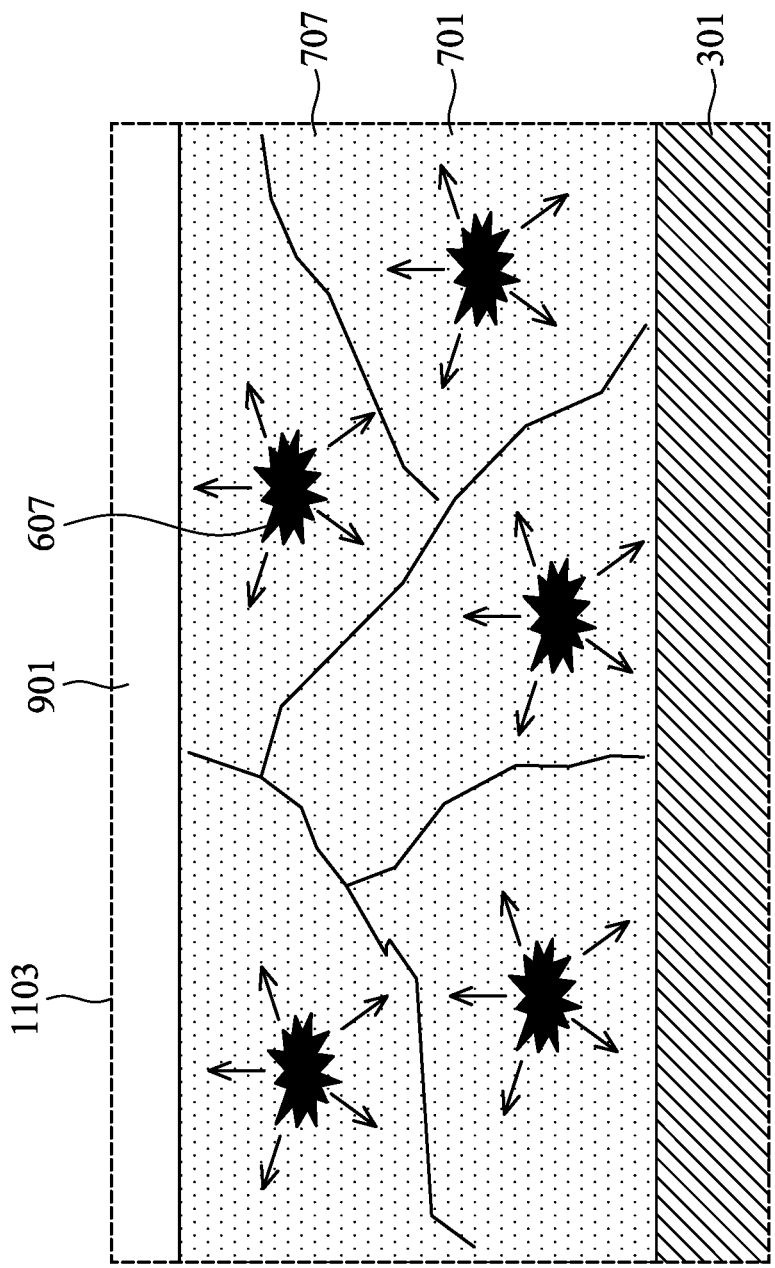

FIGS. 11A-11B illustrate a use of the second annealing process 703 to crystallize the seeded ferroelectric film 601 into the crystallized ferroelectric layer 701 with the capping layer 901 in place. In an embodiment the second annealing process 703 may be performed as described above with respect to FIG. 7A, such as by using a thermal annealing process in an inert atmosphere. However, any suitable process may be utilized to crystallize the seeded ferroelectric film 601 and form the crystallized ferroelectric layer 701.

FIG. 11B illustrates a close up view of the dashed box 1103 in FIG. 11A. As illustrated, after the second annealing process 703, the seeded ferroelectric film 601 will crystallize to form the crystals 707. For example, the seeds 607 will nucleate the formation of the crystals 707 and the crystals 707 will grow outwards from the separate seeds 607 until they run into other crystals 707.

However, by using the capping layer 901, additional stress may be added to the seeded ferroelectric film 601 during the second annealing process 703 and the crystallization process. This added stress may be utilized to modify the crystalline phase of the crystals 707 within the crystallized ferroelectric layer 701. In a particular embodiment in which the capping layer 901 is utilized, the crystals 707 may be grown to have a crystalline orientation of c-axis perpendicular to the substrate. However, any suitable crystalline orientation may be utilized.

Figure 12:
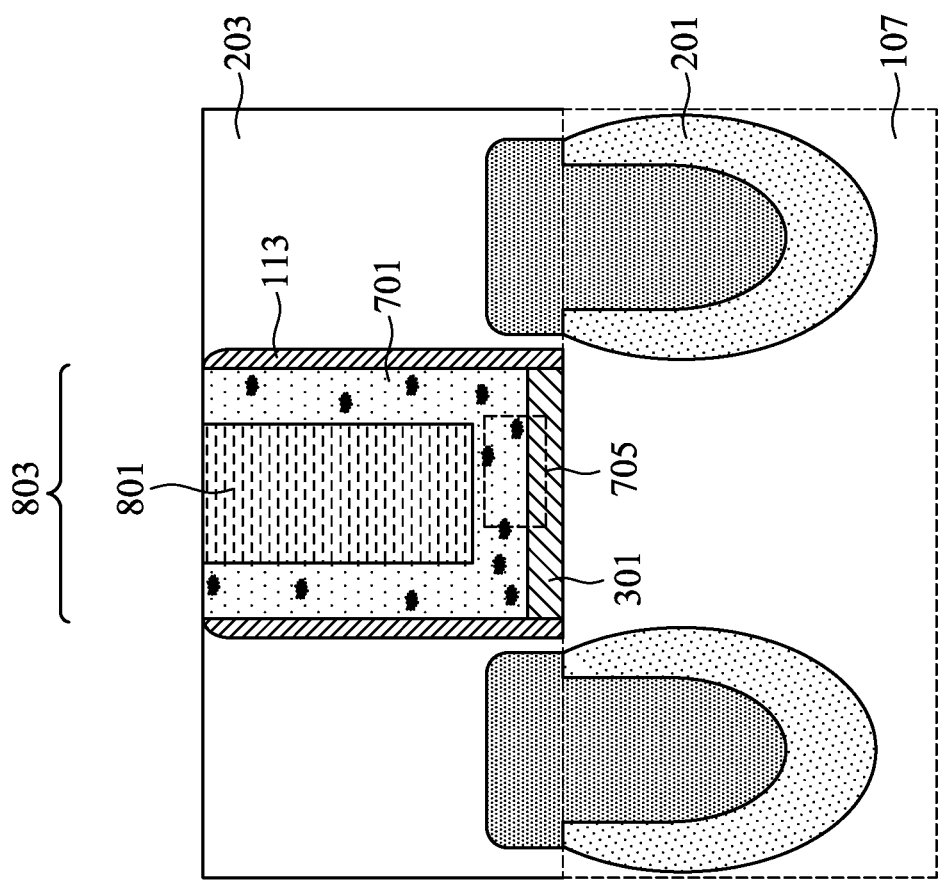
FIG. 12 illustrates a formation of the conductive gate stack in accordance with some embodiments.

FIG. 12 illustrates a removal of the capping layer 901 and a formation of the conductive stack 801. In an embodiment the capping layer 901 may be removed through the use of, for example, one or more etching processes such as a wet etching process that utilizes etchants that are selective to the material of the capping layer 901 without significantly removing surrounding material. However, any suitable removal process may be utilized.

Once the capping layer 901 has been removed, the conductive stack 801 may be formed. In an embodiment the conductive stack 801 may be formed as described above with respect to FIG. 8. For example, the first metal material, the second metal material, and the third metal material to fill the opening left by the removal of the dummy gate electrode 111, and excess material may be planarized to form the conductive stack 801 and the gate stack 803. However, any suitable methods and materials may be utilized.

Additionally, while embodiments have been described with respect to FIGS. 9A-12 which utilize the capping layer 901, different variants of these embodiments may also be used without extending beyond the scope of the embodiments. For example, in some embodiments the metal layer 401 may be formed over the ferroelectric film 501; the metal layer 401 may be diffused into the ferroelectric film 501; and the crystallization process and formation of the conductive stack 801 may be performed without forming the capping layer 901. In other embodiments the capping layer 901 may not be removed such that the capping layer 901 is part of the gate stack 803. These and any other suitable variations are fully intended to be included within the scope of the embodiments.

By introducing the seeds 607 through the use of the metal layer 401 on a top surface of the ferroelectric film 501, an additional method of controlling the crystalline phase of the crystallized ferroelectric layer 701 may be utilized. Further, by also adding in the use of the capping layer 901, the process may further be used to control the grain size of the crystals 707 formed within the crystallized ferroelectric layer 701.

Figure 13:
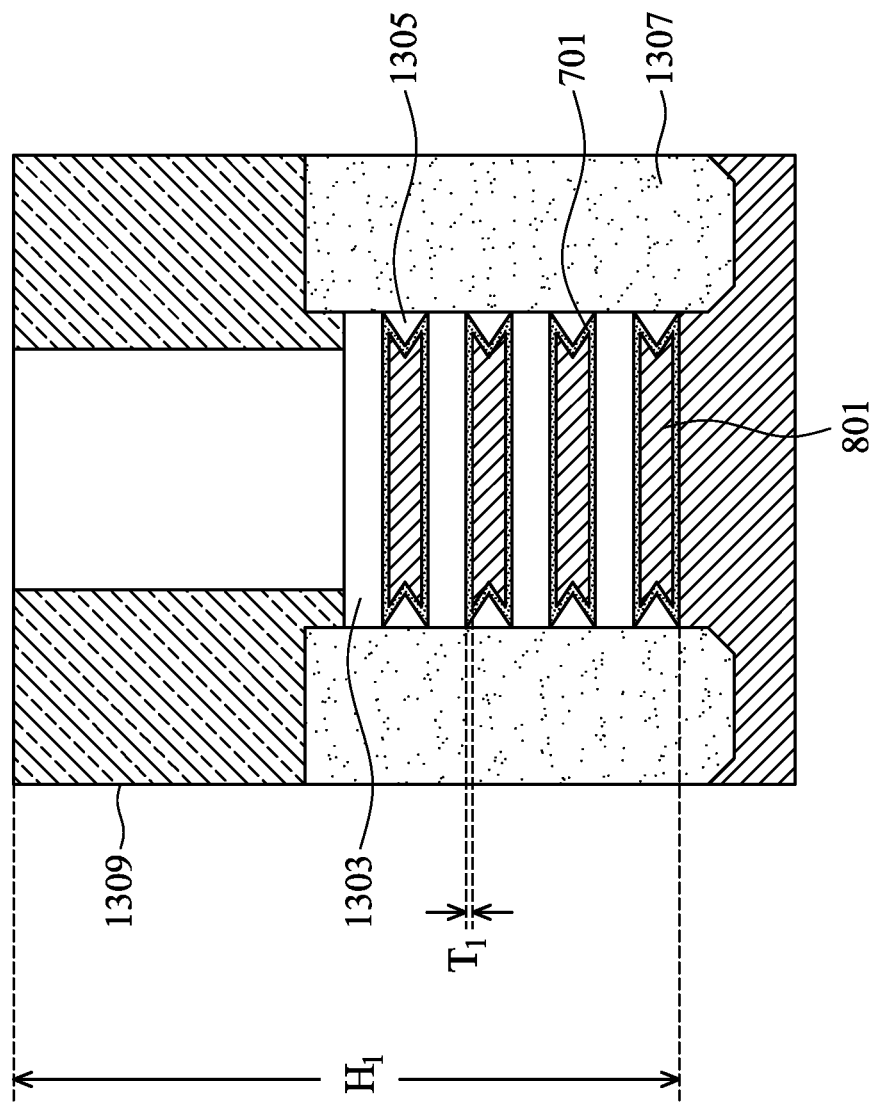
FIG. 13 illustrates a gate all around device in accordance with some embodiments.

FIG. 13 illustrates an incorporation of the use of the metal layer 401 and the ferroelectric film 501 to form the crystallized ferroelectric layer 701 in an embodiment which forms a gate all around (GAA) device 1301 with nanostructures 1303 such as nanosheets or nanowires. In such an embodiment an alternating stack of first layers of semiconductor materials and second layers of semiconductor materials are formed.

According to some embodiments, the first layers may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer of the first semiconductor material (e.g., SiGe) is epitaxial grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layers is formed to thicknesses of between about 30 Å and about 300 Å. However, any suitable thickness may be utilized while remaining within the scope of the embodiments.

After each of the first layers has been formed, respective ones of the second layers may be formed over the first layer. According to some embodiments, the second layers may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer. In a particular embodiment in which the first layer is silicon germanium, the second layer is a material such as silicon. However, any suitable combination of materials may be utilized for the first layers and the second layers.

In some embodiments, the second layer is epitaxially grown on the first layer using a deposition technique similar to that used to form the first layer. However, the second layer may use any of the deposition techniques suitable for forming the first layer, as set forth above or any other suitable techniques. According to some embodiments, the second layer is formed to a similar thickness to that of the first layer. However, the second layer may also be formed to a thickness that is different from the first layer. According to some embodiments, the second layer may be formed to a thicknesses of between about 10 Å and about 500 Å. However, any suitable thickness may be used.

Once the stack is formed, the stack is patterned into, e.g., a fin of the alternative semiconductor materials. Once patterned, a dummy gate stack is formed, and exposed portions of the fin are removed. Spacers 1305 are formed and source/drain regions 1307 are grown using, for example, an epitaxial growth process. An interlayer dielectric layer 1309 is deposited over the source/drain regions 1307, and the dummy gate is removed to re-expose the fin. Once the fin has been exposed, one of the alternating stack of materials (e.g., silicon or silicon germanium) is removed to form a stack of the nanostructures 1303 (made from, e.g., silicon or silicon germanium) that extend between the source/drain regions 1307.

Once the stack of nanostructures 1303 has been formed and is exposed, the metal layer 401 and the ferroelectric film 501 may be deposited adjacent to each other as described above. To form the crystallized ferroelectric layer 701, the first annealing process 603 and the second annealing process 703 are utilized to diffuse the seeds into the ferroelectric film 501 and then to crystallize the ferroelectric film 501 into the crystallized ferroelectric layer 701. In this embodiment, however, the crystallized ferroelectric layer 701 is located around each of the nanostructures 1303 within the stack of nanostructures 1303.

Once the crystallized ferroelectric layer 701 has been formed around the nanostructures, the gate stack 803 may be deposited around the crystallized ferroelectric layer 701. In an embodiment the gate stack 803 may be deposited as described above with respect to FIG. 8. However, any suitable materials may be utilized for the gate stack 803. Additionally, in some embodiments, once the crystallized ferroelectric layer 701 has been formed, it will have a second thickness $T_2$ of between about 2 nm and about 10 nm, while the conductive stack 801 has a first height $H_1$ of between about 20 nm and about 70 nm. As such, there may be a ratio of the second thickness $T_2$ to the first height $H_1$ of between about 0.03 and about 0.5. However, any suitable dimensions and ratios may be utilized.

Figure 14A:
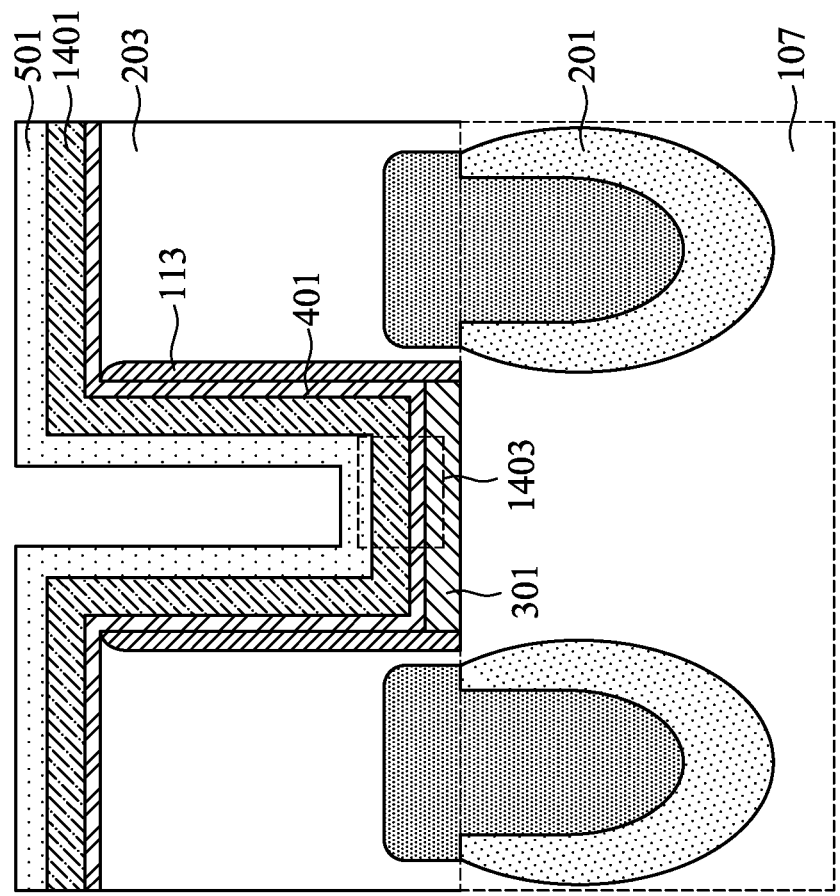
FIGS. 14A-16B illustrate uses of additives in accordance with some embodiments.
Figure 14B:
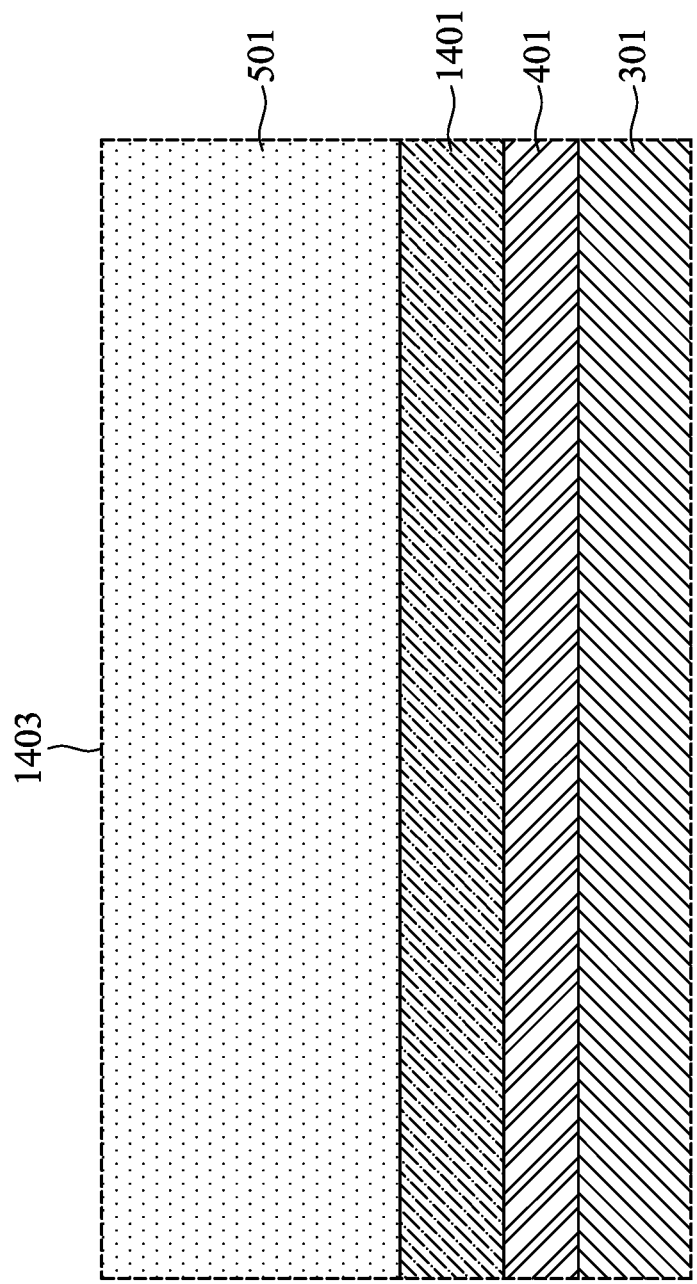

FIGS. 14A-14B illustrate another embodiment in which additional additives (of which the individual atoms of the additive 1503 are not separately illustrated in FIGS. 14A-14B but which can be represented in FIGS. 15A-15B below) are added to the ferroelectric film 501 prior to the crystallization, with FIG. 14B illustrating a close-up view of dashed box 1403 in FIG. 14A. In an embodiment the additives may be atoms or materials which are utilized to help drive the crystallization of the crystallized ferroelectric layer 701 even further towards the orthorhombic shape, such as yttrium, nitrogen, germanium, combinations of these, or the like. However, any suitable additive may be utilized.

In order to introduce the desired additive, an additive layer 1401 may be formed adjacent to the ferroelectric film 501. In the embodiment illustrated in FIGS. 14A-14B the additive layer 1401 may be deposited after deposition of the metal layer 401 and prior to deposition of the ferroelectric film 501, such that the additive layer 1401 is located between the ferroelectric film 501 and the metal layer 401.

However, in other embodiments the additive layer 1401 may be formed in other locations. For example, the additive layer 1401 may be deposited after the deposition of the ferroelectric film 501 such that the ferroelectric film 501 is located between the additive layer 1401 and the metal layer 401. In another embodiment the additive layer 1401 may be deposited prior to the metal layer 401 such that the metal layer 401 is located between the additive layer 1401 and the ferroelectric film 501. However, any suitable location may be utilized.

In an embodiment the additive layer 1401 may deposited using materials which include the additive atoms (e.g., yttrium, nitrogen, germanium, etc.). For example, in some embodiments the additive layer may include materials such as lanthanum (La), gadolinium (Gd), strontium (Sr), combinations of these, or the like, deposited using methods such as chemical vapor deposition, sputtering, atomic layer deposition, combinations of these, or the like. However, any suitable materials and deposition methods may be utilized.

The additive layer 1401 may be formed to a thickness based on the desired concentration of the additive within the ferroelectric film 501 after diffusion. In an embodiment in which the desired concentration is between about 0.2% and about 50%, the additive layer 1401 may have a thickness of between about 0.2 nm and about 20 nm. However, any suitable thicknesses may be utilized.

Figure 15A:
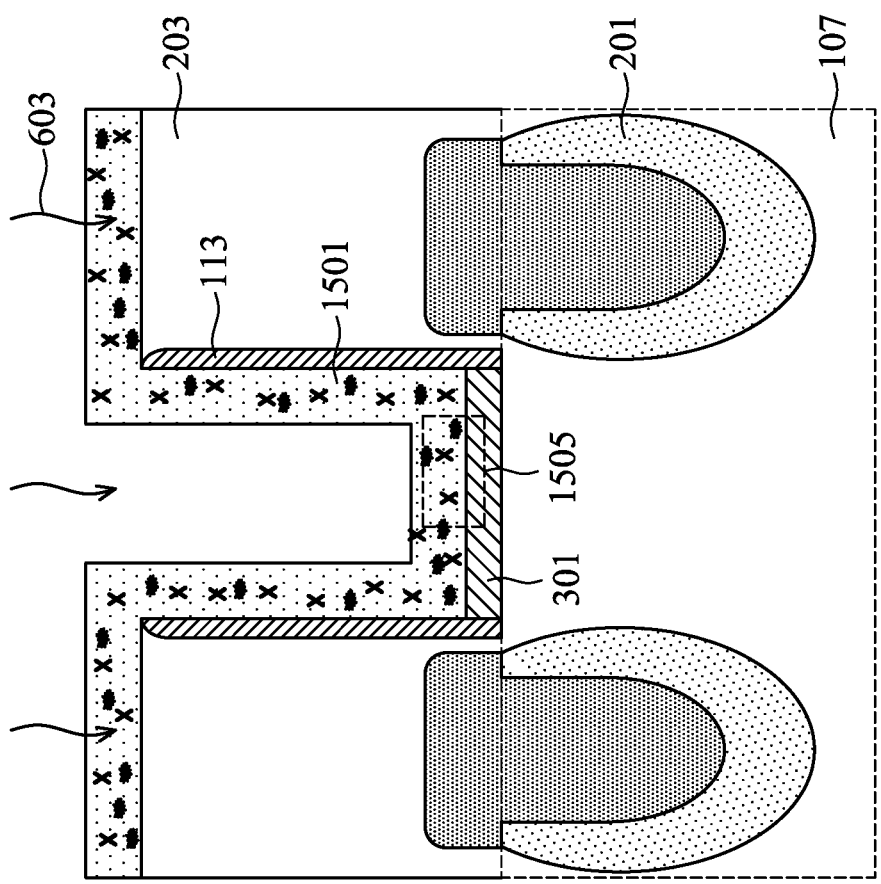
Figure 15B:
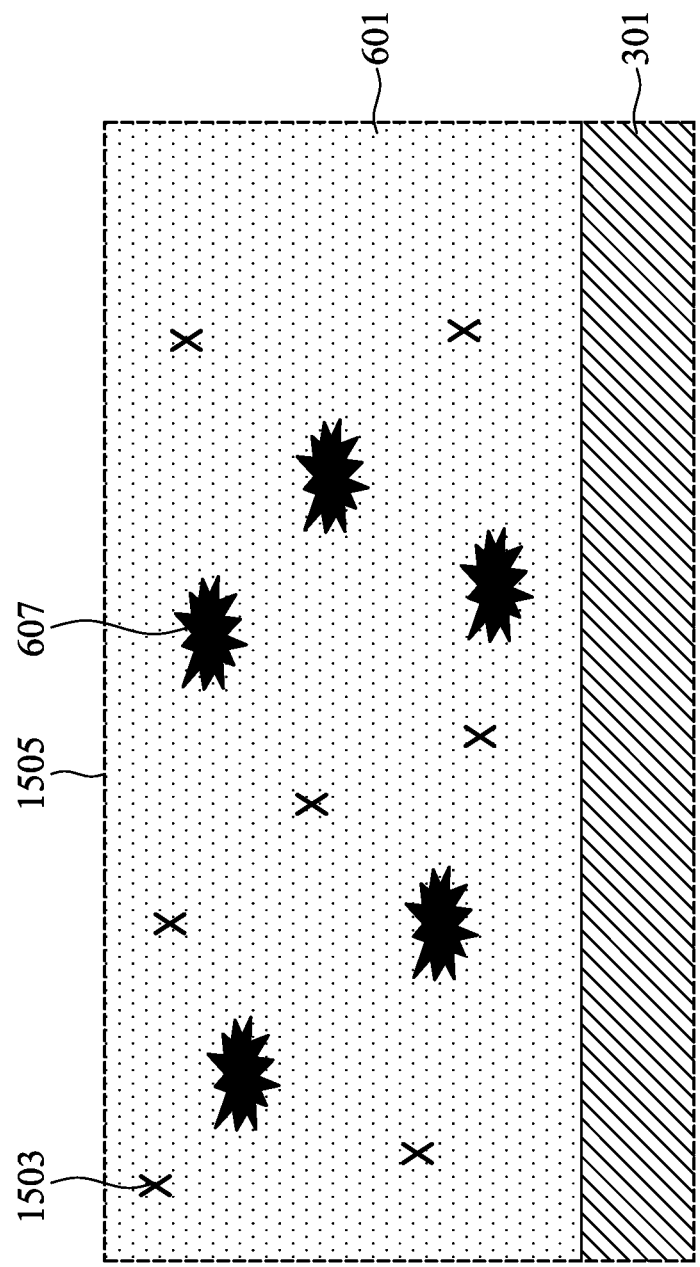

FIGS. 15A-15B illustrate a resulting structure after the first annealing process 603 has been performed such that the ferroelectric film 501 absorbs both the material of the metal layer 401 (e.g., the seeds 607) and also the material of the additive layer 1401 (e.g., the additives 1503) to form an additive included ferroelectric layer 1501, with FIG. 15B illustrating a close up view of the dashed box 1505 in FIG. 15A. In an embodiment the first annealing process 603 may be performed as described above with respect to FIGS. 6A-6B. However, any suitable method of diffusing both the metal layer 401 and the additive layer 1401 may be utilized.

Figure 16A:
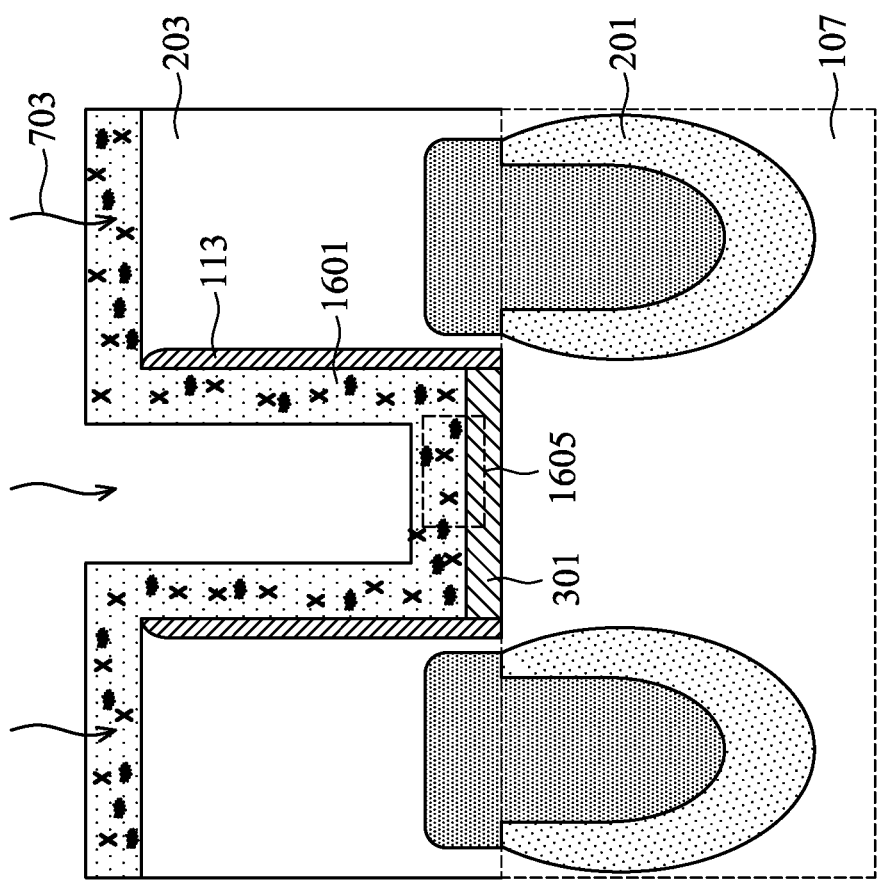
Figure 16B:
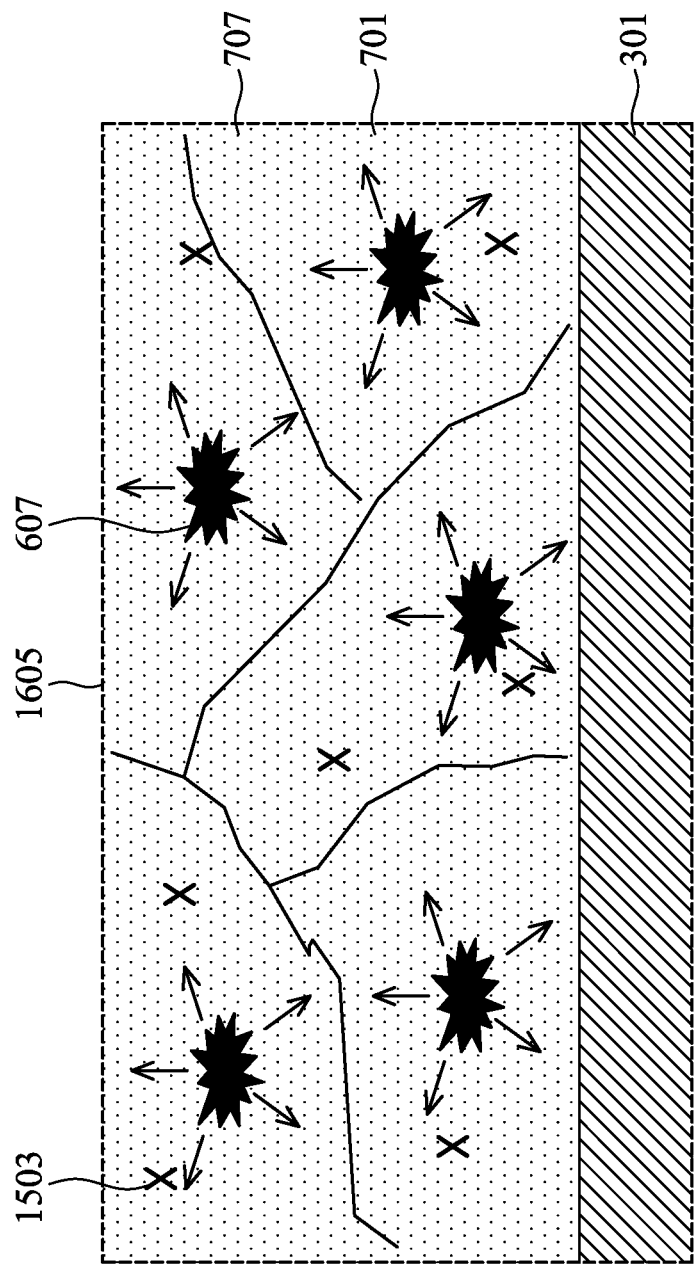

FIGS. 16A-16B illustrate a resulting structure after the second annealing process 703 has been performed such that the additive included ferroelectric layer 1501 crystallizes to an additive included crystallized ferroelectric layer 1601, with FIG. 16B illustrating a close up view of the dashed box 1605 of FIG. 16A. As can be seen, during the second annealing process 703, the seeds 607 and the additives 1503 work together to crystallize the material of the additive included ferroelectric layer 1501.

In an embodiment, by using the additives 1503, the material of the crystallized ferroelectric layer 1601 will have an even larger amount of material which crystallizes to the orthorhombic crystalline phase in order to increase the ferroelectricity of the material. In an embodiment the use of the additives 1503 may cause between about 70% and about 95% of the material of the crystallized ferroelectric layer 1601 to have the orthorhombic crystalline phase. However, any suitable amount may be utilized.

Additionally, while the use of the additive layer 1401 is described above as one method of introducing the additives 1503, this method is intended to be illustrative and is not intended to be limiting to the embodiments. In another embodiment, the additive 1503 may be introduced using a dopant implantation method or having the dopants be introduced using an additional deposition precursor during the deposition of the ferroelectric film 501. Any suitable method of introducing the additives 1503 may be utilized, and all such methods are fully intended to be included within the scope of the embodiments.

Figure 17:
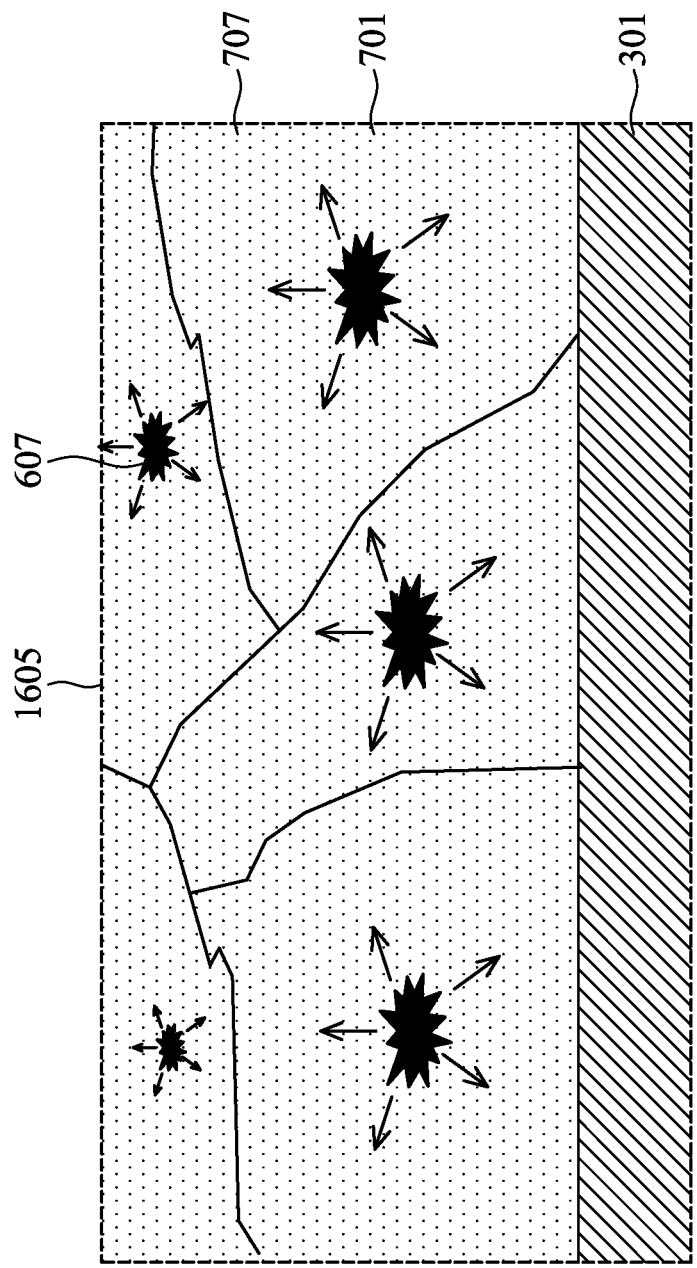
FIG. 17 illustrates a grain size distribution within the crystallized ferroelectric layer in accordance with some embodiments.

FIG. 17 illustrates yet another embodiment which tunes the first annealing process 603 and the second annealing process 703 to further control the grain size of the crystals formed using the seeds 607. In this particular embodiment the first annealing process 603 is performed at a high enough temperature that the first annealing process 603 not only helps to induce the diffusion of the seeds 607 into the ferroelectric film 501, but will also induce a partial crystallization of the material of the ferroelectric film 501.

For example, for a partial crystallization, the first annealing process 603 may be performed at a temperature of between about 300° C. and about 600° C. Additionally, to ensure that there is not a complete crystallization which will prevent further diffusion of the seeds 607, the first annealing process 603 may be performed for a time of between about 1 minute and about 60 minute. However, any suitable time and temperature may be utilized.

With a partial crystallization, the material of the ferroelectric film 501 will begin to crystallize wherever the seeds 607 enter the material of the ferroelectric film 501. As such, because the seeds 607 begin to enter the ferroelectric film 501 at the interface between the metal layer 401 and the ferroelectric film 501, the material of the ferroelectric film 501 will begin to crystallize along the interface between the metal layer 401 and the ferroelectric film 501 while material that is further from the interface remains uncrystallized.

Once the first annealing process 603 has been completed, the second annealing process 703 may be performed to continue and complete the crystallization of the material of the ferroelectric film 501. In an embodiment the second annealing process 703 may be performed as described above with respect to FIG. 7. However, any suitable process may be utilized.

By performing a partial crystallization using the first annealing process 603, the crystals 705 will have a size distribution present throughout the thickness of the crystallized ferroelectric layer 701. For example, crystals 705 that began the crystallization first (e.g., crystals 705 formed from materials located along the previous interface between the metal layer 401 and the ferroelectric film 501) and which have the longest time to grow, may have a grain size of between about 3 nm and about 10 nm. Additionally, crystals 705 that began the crystallization later (e.g., crystals 705 formed from materials located on an opposite side of the ferroelectric film 501 from the interface between the metal layer 401 and the ferroelectric film 501) and which have the smallest time to grow, may have a grain size of between about 1 nm and about 7 nm. However, any suitable grain sizes may be utilized.

In accordance with an embodiment, a semiconductor device includes: an interfacial layer over a semiconductor fin; a crystallized ferroelectric layer in physical contact with the interfacial layer, the crystallized ferroelectric layer comprising multiple crystalline regions with grain boundaries between adjacent ones of the multiple crystalline regions, each one of the multiple crystalline regions comprising one of a plurality of metallic seeds; and a conductive stack over the crystallized ferroelectric layer. In an embodiment the metallic seeds are a metal oxide. In an embodiment the crystallized ferroelectric layer comprises a transition metal oxide, and the metallic seeds comprise a metal bonded to the transition metal oxide. In an embodiment the metallic seeds are evenly distributed within the crystallized ferroelectric layer. In an embodiment the metallic seeds are nickel oxide. In an embodiment the metallic seeds are magnesium oxide. In an embodiment the metallic seeds are hafnium aluminum oxide.

In accordance with another embodiment, a semiconductor device includes: a conductive gate stack over a semiconductor fin; spacers over the semiconductor fin; and a crystallized ferroelectric layer between the conductive gate stack and the spacers, the crystallized ferroelectric layer comprising a plurality of crystal regions, the crystal regions each comprising a metal seed and having a grain boundary with a diameter of between about 2 nm and about 20 nm. In an embodiment a density of the metal seed within the crystallized ferroelectric layer is between about 10,000 seeds/$\mu m^2$ and about 250,000 seeds/$\mu m^2$. In an embodiment the metal seed is nickel oxide. In an embodiment the metallic seed is hafnium aluminum oxide. In an embodiment the semiconductor device further includes an interfacial layer in physical contact with both the crystallized ferroelectric layer and the semiconductor fin. In an embodiment the crystallized ferroelectric layer comprises hafnium dioxide.

In accordance with yet another embodiment, a method of manufacturing a semiconductor device, the method including: forming a metal material over a semiconductor fin; forming a ferroelectric layer in physical contact with the metal material; diffusing the metal material into the ferroelectric layer to form seeds; crystallizing the ferroelectric layer using the seeds to form a crystallized ferroelectric layer; and forming a conductive stack over the crystallized ferroelectric layer. In an embodiment the diffusing the metal material is performed at least in part with a first annealing process. In an embodiment the crystallizing the ferroelectric layer is performed at least in part with a second annealing process. In an embodiment a temperature of the second annealing process is higher than a temperature of the first annealing process. In an embodiment the temperature of the first annealing process is between about 300° C. and about 600° C. and the temperature of the second annealing process is between about 400° C. and about 800° C. In an embodiment the metal material reacts with a material of the ferroelectric layer to form the seeds. In an embodiment the seeds are the metal material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    performing a first annealing process to diffuse a metal material into a ferroelectric layer, the metal material overlying a semiconductor fin;
    performing a second annealing process to crystallize the ferroelectric layer into a crystallized ferroelectric layer; and
    forming a conductive stack over the crystallized ferroelectric layer.

2. The method of claim 1, wherein prior to the performing the first annealing process the metal material is located between the ferroelectric layer and the semiconductor fin.

3. The method of claim 1, wherein prior to the performing the first annealing process the ferroelectric layer is located between the metal layer and the semiconductor fin.

4. The method of claim 1, wherein the metal material reacts with material of the ferroelectric layer during the performing the first annealing process.

5. The method of claim 1, wherein the metal material does not react with material of the ferroelectric layer during the performing the first annealing process.

6. The method of claim 1, wherein the metal material comprises a metal atom bonded to a transportation atom.

7. A method of manufacturing a semiconductor device, the method comprising:
    forming a fin overlying a semiconductor substrate;
    forming an opening within a dielectric layer over the fin;
    lining the opening with a ferroelectric material;
    using a first annealing process to implant seeds into the ferroelectric material;
    using a second annealing process to crystallize the ferroelectric material into a crystallized ferroelectric material; and
    forming a conductive material adjacent to the crystallized ferroelectric material.

8. The method of claim 7, wherein the crystallized ferroelectric material has a seed density of between 10,000 seeds/$\mu m^2$ to 250,000 seeds/$\mu m^2$.

9. The method of claim 8, wherein a grain size of crystals within the crystallized ferroelectric material is between 2 nm and 10 nm.

10. The method of claim 7, further comprising depositing a capping layer over the ferroelectric material prior to the using the first annealing process.

11. The method of claim 10, wherein the capping layer comprises silicon doped titanium nitride.

12. The method of claim 11, wherein the capping layer has a thickness of between 10 Å and 50 Å.

13. The method of claim 7, wherein the using the first annealing process reacts the ferroelectric material with a first reactant.

14. The method of claim 7, wherein the using the first annealing process does not react the ferroelectric material with a first reactant.

15. A method of manufacturing a semiconductor device, the method comprising:
    forming a semiconductor fin over a semiconductor substrate; and
    forming a gate stack over the semiconductor fin, the forming the gate stack comprising:
        depositing a ferroelectric material;
        depositing a metal layer in physical contact with the ferroelectric material;
        annealing the metal layer and the ferroelectric material to implant seeds in the ferroelectric material;
        annealing the seeds to crystallize the ferroelectric material; and
        depositing a conductive stack over the ferroelectric material after the annealing the seeds.

16. The method of claim 15, wherein the metal layer is deposited to a thickness of between 0.5 nm and 5 nm.

17. The method of claim 15, wherein a ratio of a first thickness of the ferroelectric material to a second thickness of the metal layer is between about 5 and about 20.

18. The method of claim 17, wherein a ratio of a first thickness of the ferroelectric material to a second thickness of the metal layer is between about 5 and about 10.

19. The method of claim 15, wherein the implanting the seeds reacts the metal material with the ferroelectric material.

20. The method of claim 15, wherein the implanting the seeds does not react the metal material with the ferroelectric material.

* * * * *